(12) United States Patent
Kim et al.

(10) Patent No.: US 11,876,043 B2
(45) Date of Patent: Jan. 16, 2024

(54) SEMICONDUCTOR DEVICES HAVING VIAS ON A SCRIBE LANE REGION

(71) Applicant: Samsung Electronics Co., Ltd., Suwon-si (KR)

(72) Inventors: Jooncheol Kim, Seoul (KR); Sangwoo Hong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 212 days.

(21) Appl. No.: 16/865,544

(22) Filed: May 4, 2020

(65) Prior Publication Data

US 2021/0082809 A1    Mar. 18, 2021

(30) Foreign Application Priority Data

Sep. 16, 2019 (KR) .................. 10-2019-0113332

(51) Int. Cl.
*H01L 23/522* (2006.01)
*H01L 23/544* (2006.01)
(Continued)

(52) U.S. Cl.
CPC .......... *H01L 23/5226* (2013.01); *H01L 22/32* (2013.01); *H01L 23/528* (2013.01);
(Continued)

(58) Field of Classification Search
CPC . H01L 23/5226; H01L 22/32; H01L 23/5223; H01L 23/528; H01L 23/53295; H01L 23/544; H01L 2223/5446; H01L 27/10814; H01L 27/10855; H01L 27/10876; H01L 27/10894; H01L 2223/54426; H01L 23/5283;
(Continued)

(56) References Cited

U.S. PATENT DOCUMENTS 7,863,705 B2   1/2011 Yamazaki
8,044,482 B2   10/2011 Ota et al.
(Continued)

FOREIGN PATENT DOCUMENTS

JP   2005116788 A   4/2005
JP   2008041984 A   2/2008
(Continued)

*Primary Examiner* — Patricia D Valenzuela
(74) *Attorney, Agent, or Firm* — Muir Patent Law, PLLC

(57) ABSTRACT

A semiconductor device includes a substrate having a chip region and a scribe lane region having first edges extending in a first direction and second edges extending in a second direction, a first insulating interlayer structure on the scribe lane region and including a low-k dielectric material, first conductive structures on a portion of the scribe lane region adjacent one of the first edges and each extending through the first insulating interlayer structure in a vertical direction and extending in the first direction, a second insulating interlayer on the first insulating interlayer structure and including a material having a dielectric constant greater than that of the first insulating interlayer structure, first vias each extending in the first direction through the second insulating interlayer to contact one of the first conductive structures, and a first wiring commonly contacting upper surfaces of the first vias.

18 Claims, 27 Drawing Sheets

(51) Int. Cl.
*H01L 23/528* (2006.01)
*H01L 21/66* (2006.01)
*H01L 23/532* (2006.01)
*H01L 21/311* (2006.01)
*H01L 21/3213* (2006.01)

(52) U.S. Cl.
CPC .... *H01L 23/5223* (2013.01); *H01L 23/53295* (2013.01); *H01L 23/544* (2013.01); *H01L 21/31144* (2013.01); *H01L 21/32139* (2013.01); *H01L 2223/5446* (2013.01)

(58) Field of Classification Search
CPC ......... H01L 27/10823; H01L 27/10885; H01L 27/10888; H01L 27/10802; H01L 21/76; H01L 21/76813; H01L 21/76829; H01L 21/76838; H01L 21/76897; H01L 21/31144; H01L 21/32139; H10B 12/09; H10B 12/0335; H10B 12/053; H10B 12/315; H10B 12/34; H10B 12/482; H10B 12/485; H10B 12/20
See application file for complete search history.

(56) References Cited

U.S. PATENT DOCUMENTS

| | | | |
|---|---|---|---|
| 9,087,891 B2 | 7/2015 | Yoshizawa et al. | |
| 2007/0114668 A1 | 5/2007 | Goto et al. | |
| 2010/0148314 A1* | 6/2010 | Han | H01L 22/34 257/E21.546 |
| 2012/0146185 A1* | 6/2012 | Nagai | H01L 28/55 257/532 |
| 2012/0149135 A1* | 6/2012 | Sugimura | H01L 21/31144 257/E21.53 |
| 2015/0126013 A1* | 5/2015 | Hwang | H01L 27/2436 438/672 |
| 2017/0062321 A1* | 3/2017 | Choi | H01L 24/09 |
| 2017/0213786 A1* | 7/2017 | Ahn | H01L 23/4821 |
| 2018/0026068 A1* | 1/2018 | Ogi | H01L 27/14685 257/432 |
| 2020/0343280 A1* | 10/2020 | Ishino | H01L 27/14603 |

FOREIGN PATENT DOCUMENTS

| | | | |
|---|---|---|---|
| JP | 2012039001 A | 2/2012 | |
| JP | 2013105919 A | 5/2013 | |
| KR | 20070019134 A | 2/2007 | |

* cited by examiner

FIG. 2
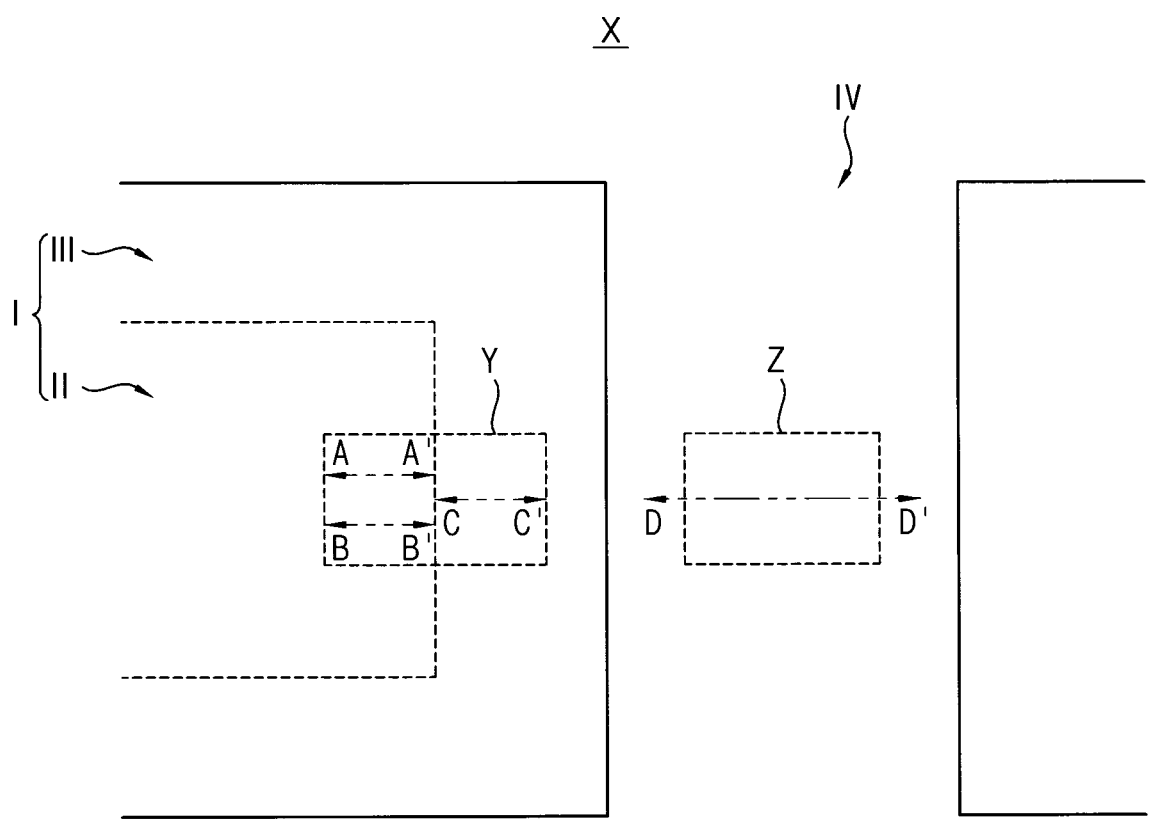
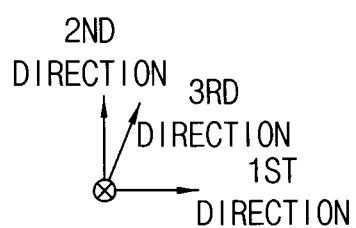

SEMICONDUCTOR DEVICES HAVING VIAS ON A SCRIBE LANE REGION

CROSS-REFERENCE TO RELATED APPLICATION

This application claims priority under 35 U.S.C. § 119 to Korean Patent Application No. 10-2019-0113332, filed on Sep. 16, 2019, in the Korean Intellectual Property Office, the disclosure of which is hereby incorporated by reference in its entirety.

TECHNICAL FIELD

Example embodiments of the present disclosure relate to semiconductor devices, and more specifically, to DRAM devices.

DISCUSSION OF RELATED ART

A wafer may include a plurality of chip regions and a scribe lane region surrounding them, and a test element group (TEG) for testing electrical characteristics of elements on the chip regions, an alignment key, etc., may be formed on the scribe lane region. After forming semiconductor chips on the wafer, a dicing process for cutting the wafer and structures thereon may be performed through the scribe lane region so that the semiconductor chips may be divided. The dicing process may not be easily performed due to the structures such as the TEG on the scribe lane.

SUMMARY

According to example embodiments of the inventive concepts, a semiconductor device may include a substrate, a first insulating interlayer structure, first conductive structures, a second insulating interlayer, first vias, and a first wiring. The substrate may include a chip region and a scribe lane region surrounding the chip region. The scribe lane region may have first edges opposite to each other and second edges opposite to each other. Each of the first edges may extend in a first direction and each of the second edges may extend in a second direction crossing the first direction. The first insulating interlayer structure may be formed on the scribe lane region of the substrate, and may include a low-k dielectric material. The first conductive structures may be formed on a portion of the scribe lane region of the substrate adjacent one of the first edges. Each of the first conductive structures may extend through the first insulating interlayer structure in a vertical direction substantially perpendicular to an upper surface of the substrate and extend in the first direction. The second insulating interlayer may be formed on the first insulating interlayer structure, and may include a material having a dielectric constant greater than that of the first insulating interlayer structure. The first vias may each extend in the first direction through the second insulating interlayer to contact one of the first conductive structures. The first wiring may commonly contact upper surfaces of the first vias.

According to example embodiments of the inventive concepts, a semiconductor device may include a substrate, contact plugs, conductive structures, and a second wiring. The substrate may include a chip region and a scribe lane region surrounding the chip region. The scribe lane region may have first edges opposite to each other and second edges opposite to each other. Each of the first edges may extend in a first direction and each of the second edges may extend in a second direction crossing the first direction. The contact plugs may be formed on the scribe lane region of the substrate. The conductive structures may be formed on the contact plugs on a portion of the scribe lane region of the substrate adjacent one of the first edges. The conductive structures may include first wirings and first vias alternately and repeatedly stacked in a vertical direction substantially perpendicular to an upper surface of the substrate. The second wiring may commonly contact upper surfaces of the conductive structures. Each of the first wirings and each of the first vias may extend in the first direction.

According to example embodiments of the inventive concepts, a semiconductor device may include a substrate, a gate structure, a bit line structure, a first contact plug, a capacitor, a second contact plug, a third contact plug, a first insulating interlayer, a second insulating interlayer structure, conductive structures, a third insulating interlayer, first vias, and a first wiring. The substrate may include a chip region and a scribe lane region surrounding the chip region. The scribe lane region may have first edges opposite to each other and second edges opposite to each other. Each of the first edges may extend in a first direction and each of the second edges may extend in a second direction crossing the first direction. The substrate may have first and second active patterns on the chip region and the scribe lane region, and the first and second active patterns may be defined by an isolation pattern on the substrate. The gate structure may be provided at an upper portion of the first active pattern. The bit line structure may be formed on the chip region of the substrate. The first contact plug may be formed on the first active pattern. The capacitor may be formed on the first contact plug. The second contact plug may be formed on the capacitor. The third contact plug may be formed on the second active pattern. The first insulating interlayer may contain the second and third contact plugs. The second insulating interlayer structure may be formed on the first insulating interlayer. The conductive structures may be formed on a portion of the scribe lane region of the substrate adjacent one of the first edges. Each of the first conductive structures may extend through the second insulating interlayer structure in a vertical direction substantially perpendicular to an upper surface of the substrate and may extend in the first direction. The third insulating interlayer may be formed on the second insulating interlayer structure. The third insulating interlayer may include a material having a dielectric constant greater than that of the second insulating interlayer structure. The first vias may each extend in the first direction through the third insulating interlayer to contact one of the conductive structures on the scribe lane region of the substrate. The first wiring may commonly contact upper surfaces of the first vias.

In a method of manufacturing a semiconductor device in accordance with example embodiments, semiconductor chips and a TEG may be formed on a chip region and a scribe lane region, respectively, of a wafer, and when the wafer is diced through the scribe lane region to separate the semiconductor chips, the dicing process may be guided by the conductive structures included in the TEG, and the impact generated by the dicing process may be prevented from being spread to the semiconductor chips. Accordingly, the semiconductor chips may have improved electrical characteristics.

BRIEF DESCRIPTION OF THE DRAWINGS

FIGS. 1 to 25 are plan views and cross-sectional views illustrating a method of manufacturing a semiconductor device according to example embodiments of the inventive concept.

DETAILED DESCRIPTION

The above and other aspects and features of the semiconductor devices and the methods of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

FIGS. 1 to 25 are plan views and cross-sectional views illustrating a method of manufacturing a semiconductor device according to example embodiments of the inventive concept. Specifically, FIGS. 1-3, 5, 8, 12, 17 and 20-22 are the plan views, and FIGS. 4, 6-7, 9-11, 13-16, 18-19 and 23-25 are the cross-sectional views.

FIG. 2 is an enlarged cross-sectional view of a region X of FIG. 1, FIGS. 4, 6-7, 9-11, 13-16 and 18 include cross-sections taken along lines A-A', B-B' and C-C' of regions Y and Z of corresponding plan views, and FIGS. 19 and 23-25 include cross-sections taken along lines A-A', C-C' and D-D' of regions Y and Z of corresponding plan views.

Hereinafter in the specifications (not necessarily in the claims), two directions substantially parallel to an upper surface of a substrate 100 and substantially perpendicular to each other may be defined as first and second directions, respectively, and a direction substantially parallel to an upper surface of the substrate 100 and having an acute angle with each of the second and third directions may be defined as a third direction.

Figure 1:
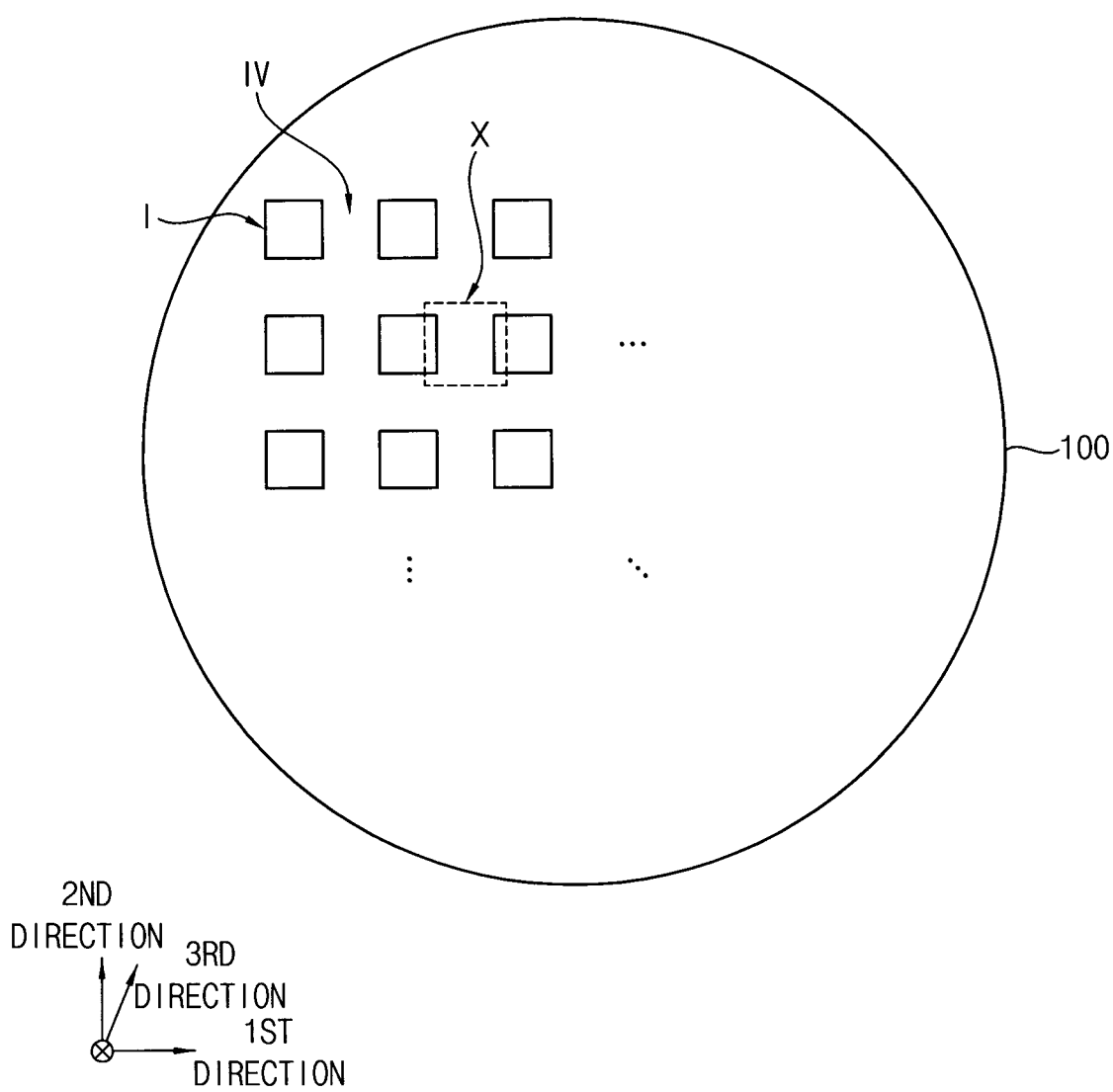

Referring to FIGS. 1 and 2, the substrate 100 may include first and fourth regions I and IV, and the first region I may include second and third regions II and III.

The substrate 100 may be a wafer including silicon, germanium, silicon-germanium, or a III-V group compound semiconductor, such as GaP, GaAs, or GaSb. In example embodiments, the substrate 100 may be a silicon-on-insulator (SOI) wafer or a germanium-on-insulator (GOI) wafer.

The first region I of the substrate 100 may be a chip region in which patterns for semiconductor chips may be formed. In example embodiments, a plurality of first regions I may be spaced apart from each other in each of the first and second directions. Each of the first regions I may include the second region II in which memory cells may be formed, and thus may be referred to as a cell region, and the third region III surrounding the second region II in which peripheral circuit patterns for driving the memory cells may be formed, and thus may be referred to as a peripheral circuit region.

The fourth region IV of the substrate 100 may be formed between the first regions I, and may be a scribe lane (or scribe line) region for cutting patterns on the substrate 100 into semiconductor chips. In example embodiments, a TEG for testing electrical characteristics or failure of elements included in the semiconductor chips, an alignment key for aligning in a photo process, etc., may be formed on the fourth region IV of the substrate 100.

Hereinafter, a method of forming elements on the Y region included in the first region I of the substrate 100 will be illustrated with reference to FIGS. 3 to 18, and then a method of forming elements on the Y and Z regions included in the first and fourth regions I and IV, respectively, of the substrate 100 will be illustrated with reference to FIGS. 19 to 25.

In example embodiments, the TEG on the fourth region IV of the substrate 100 may be formed to have a structure substantially the same as those of some elements on the second region II or the third region III of the substrate 100. Thus, when elements are illustrated with reference to FIGS. 3 to 18, structures on the fourth region IV of the substrate 100 will not be illustrated, and when elements are illustrated with reference to FIGS. 19 to 25, it may be assumed that structures on the third region IV of the substrate 100 are also formed on the fourth region IV of the substrate 100.

Figure 3:
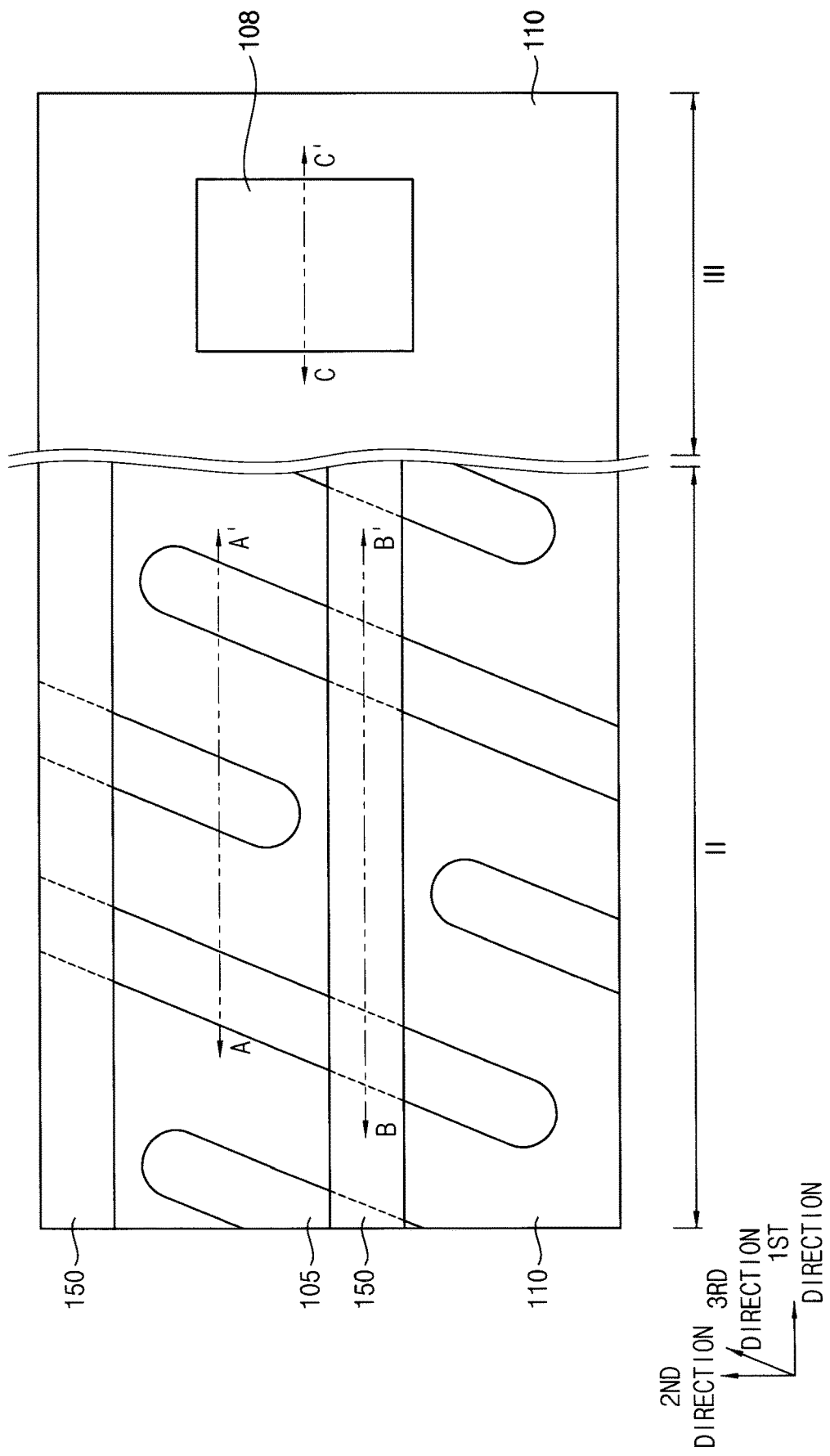
Figure 4:
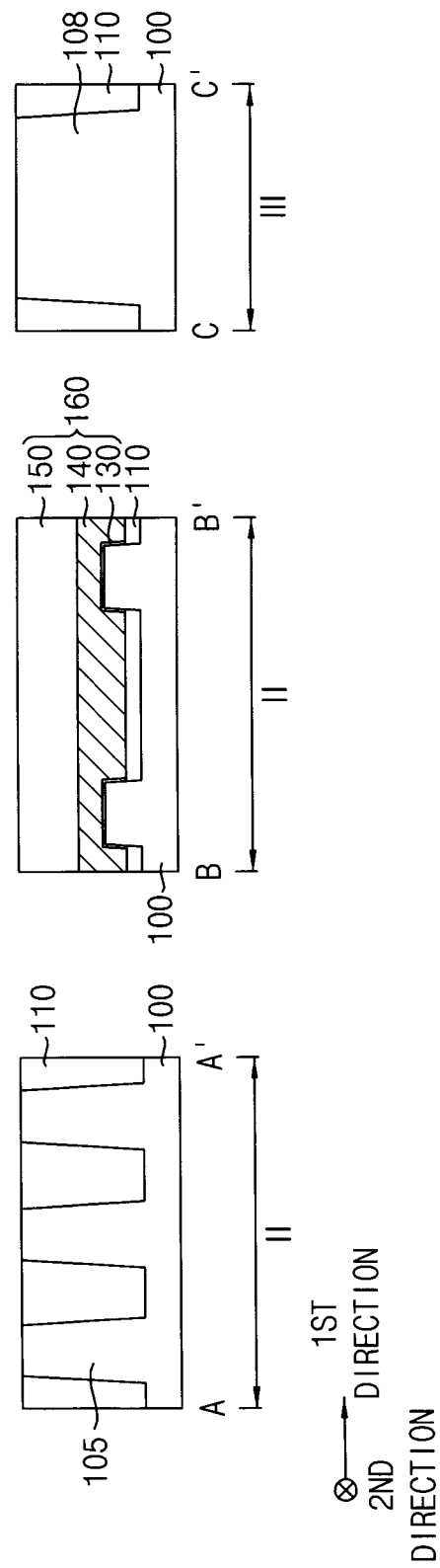

Referring to FIGS. 3 and 4, first and second active patterns 105 and 108 may be formed on the second and third regions II and III, respectively, of the substrate 100, and an isolation pattern 110 may be formed on the substrate 100 to cover sidewalls of the first and second active patterns 105 and 108.

The first and second active patterns 105 and 108 may be formed by removing an upper portion of the substrate 100 to form a first recess. A plurality of first active patterns 105 may be spaced apart from each other in the first and second directions. Each of the first active patterns 105 may extend lengthwise in the third direction.

The isolation pattern 110 may be formed by forming an isolation layer on the substrate 100 to fill the first recess and planarizing the isolation layer until upper surfaces of the first and second active patterns 105 and 108 may be exposed. In example embodiments, the planarization process may include a chemical mechanical polishing (CMP) process and/or an etch back process.

After an impurity region is formed in the substrate 100 by performing, e.g., an ion implantation process, the first active pattern 105 and the isolation pattern 110 on the second region II of the substrate 100 may be partially etched to form a second recess extending lengthwise in the first direction.

A first gate structure 160 may be formed in the second recess. The first gate structure 160 may include a first gate insulation layer 130 on a surface of the first active pattern 105 exposed by the second recess, a first gate electrode 140 on the first gate insulation layer 130 to fill a lower portion of the second recess, and a first gate mask 150 on the first gate electrode 140 to fill an upper portion of the second recess. The first gate structure 160 may extend lengthwise in the first direction, and a plurality of first gate structures 160 may be spaced apart from each other in the second direction.

The first gate insulation layer 130 may be formed by performing a thermal oxidation process on the surface of the first active pattern 105 exposed by the second recess, and thus may include, for example, silicon oxide.

Figure 5:
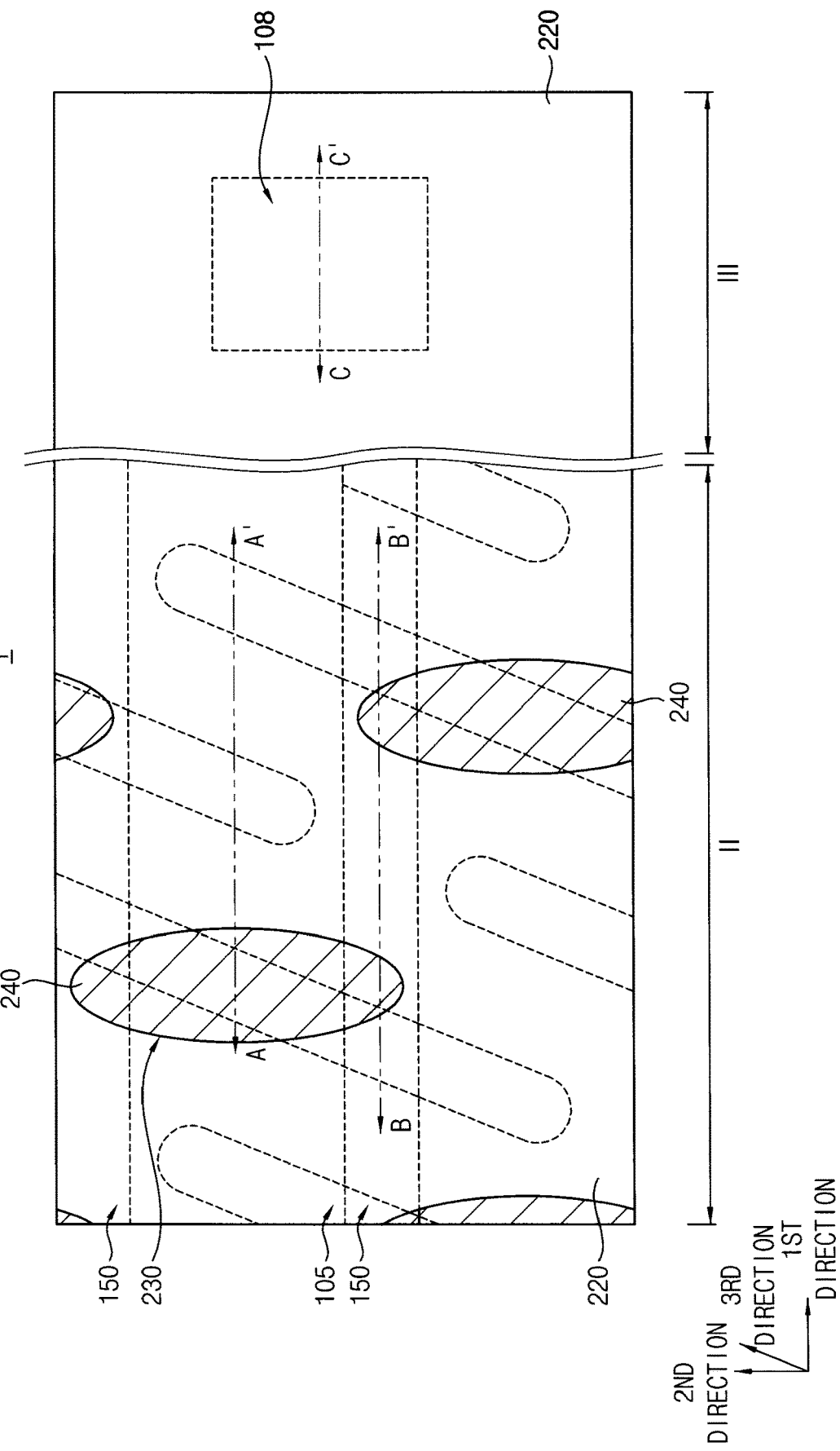
Figure 6:
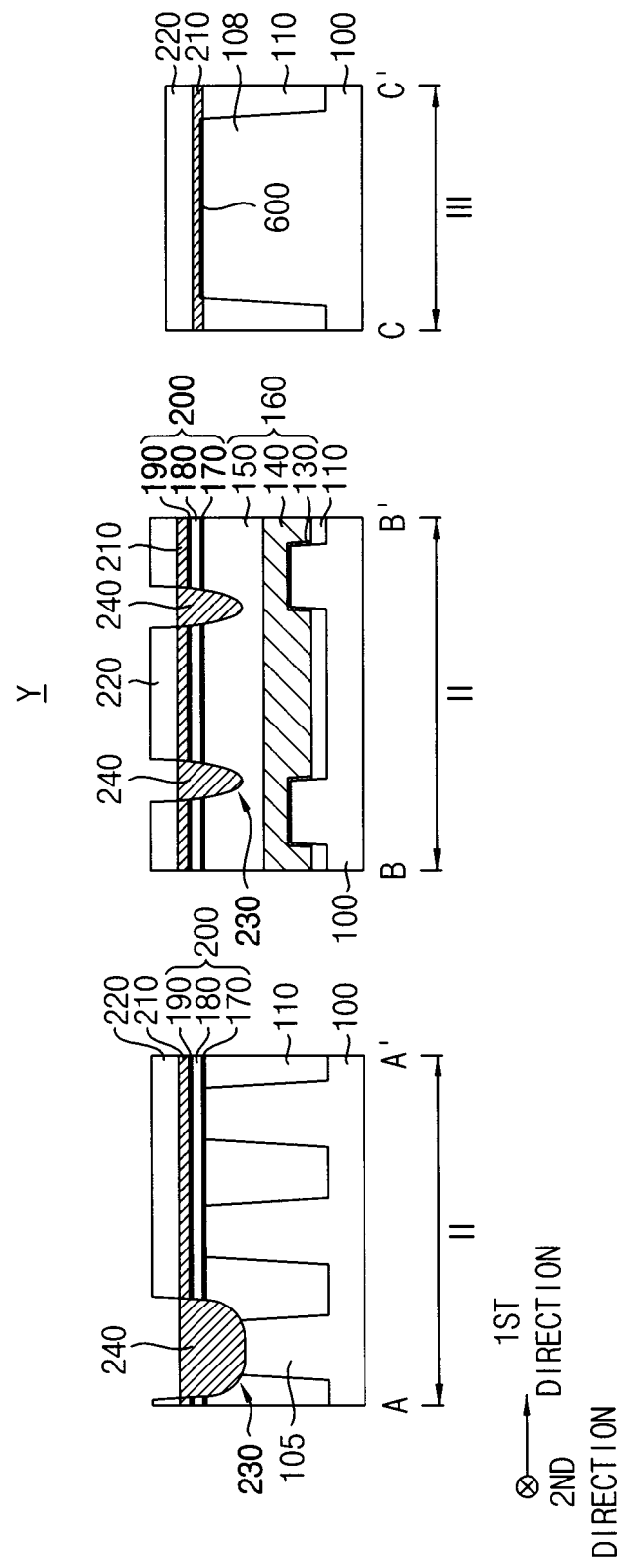

Referring to FIGS. 5 and 6, a thermal oxidation process may be performed on an upper surface of the second active pattern 108 on the third region III of the substrate 100 to form a second gate insulation layer 600, and an insulation layer structure 200 may be formed on the first active patterns 105 and the isolation pattern 110 on the second region II of the substrate 100.

In example embodiments, the insulation layer structure 200 may include first, second, and third insulation layers 170, 180, and 190 sequentially stacked. The first and third insulation layers 170 and 190 may include an oxide, e.g., silicon oxide, and the second insulation layer 180 may include a nitride, e.g., silicon nitride.

A first conductive layer 210 and a first mask 220 may be sequentially formed on the insulation layer structure 200, the second gate insulation layer 600, and the isolation pattern 110, and the first conductive layer 210 and the insulation layer structure 200 may be etched using the first mask 220 as an etching mask to form a first opening 230 exposing the first active pattern 105.

The first conductive layer 210 may include, for example, polysilicon doped with impurities, and the first mask 220 may include a nitride, e.g., silicon nitride.

During the etching process, upper portions of the first active pattern 105, the isolation pattern 10, and the first gate mask 150 exposed by the first opening 230 may be also etched to form a third recess. For example, a bottom of the first opening 230 may be referred to as the third recess. The bottom of the first opening 230 may be at a lower vertical level than top surfaces of the first active pattern 105, the isolation pattern 110, and the first gate mask 150.

In example embodiments, the first opening 230 may expose an upper surface of a central portion of each of the first active patterns 105 extending in the third direction, and thus a plurality of first openings 230 may be formed in the first and second directions.

A second conductive layer 240 may be formed to fill the first opening 230.

In example embodiments, the second conductive layer 240 may be formed by forming a preliminary second conductive layer on the first active pattern 105, the isolation pattern 110, the first gate mask 150, and the first mask 220 to fill the first opening 230, and removing an upper portion of the preliminary second conductive layer through a CMP process and/or an etch bask process. The second conductive layer 240 may have an upper surface substantially coplanar with an upper surface of the first conductive layer 210. Terms such as "same," "equal," "planar," or "coplanar." as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

In example embodiments, a plurality of second conductive layers 240 may be spaced apart from each other in the first and second directions on the second region II of the substrate 100. The second conductive layer 240 may include, for example, doped polysilicon, and may be merged to the first conductive layer 210. For example, side surfaces of the second conductive layer 240 may contact side surfaces of the first conductive layer 210.

Figure 7:
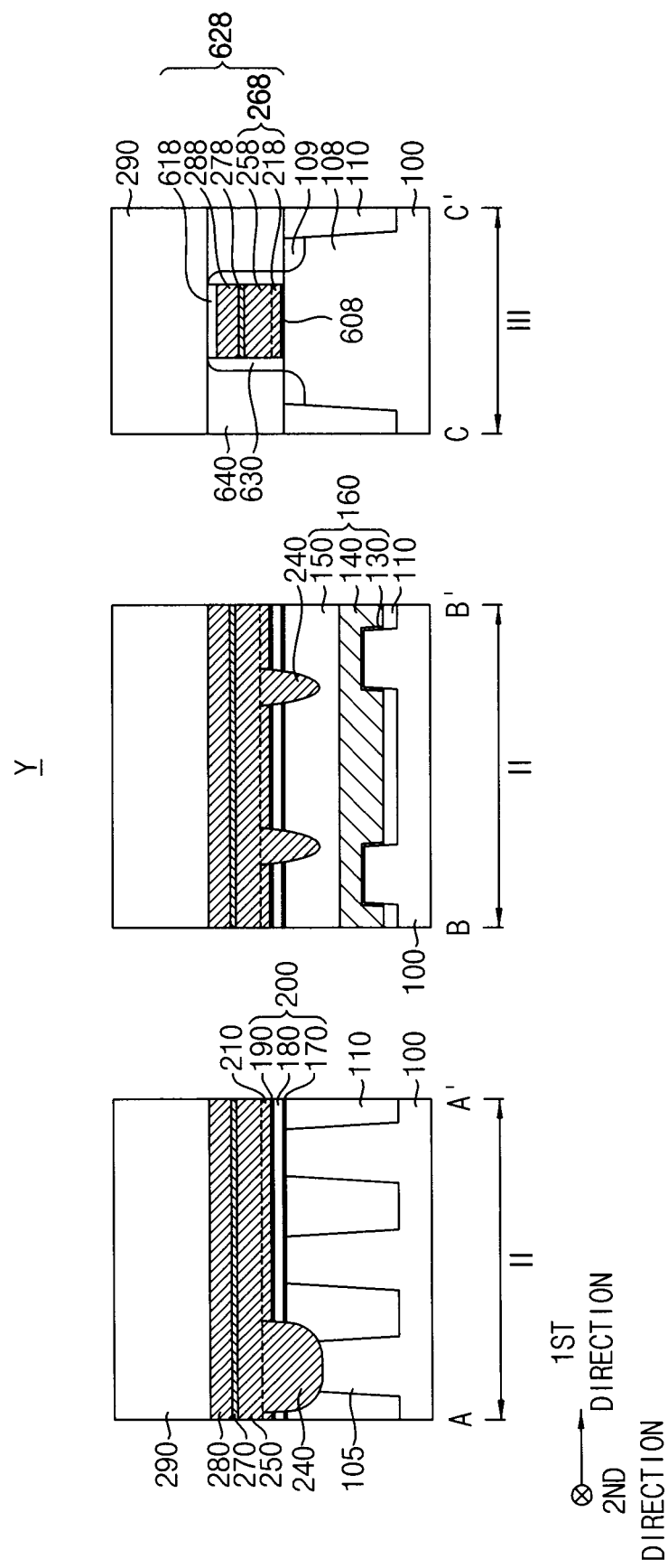

Referring to FIG. 7, after removing the first mask 220, a third conductive layer 250, a barrier layer 270, and a first metal layer 280 may be sequentially formed on the first and second conductive layers 210 and 240.

In example embodiments, the third conductive layer 250 may include a material substantially the same as that of the first and second conductive layers 210 and 240. For example, the third conductive layer 250 may include doped polysilicon, and thus, in some embodiments, may be merged with the first and second conductive layers 210 and 240.

A second mask (not shown) may be formed to cover a portion of the first metal layer 280 on the second region II of the substrate 100, a second gate mask 618 may be formed to partially cover a portion of the first metal layer 280 on the third region III of the substrate 100, and the first metal layer 280, the barrier layer 270, the third conductive layer 250, the first metal layer 210, and the second gate insulation layer 600 may be sequentially etched using the second mask and the second gate mask 618 as an etching mask.

Thus, a second gate structure 628 may be formed on the third region III of the substrate 100. The second gate structure 628 may include a second gate insulation pattern 608, a second conductive pattern 218, a fifth conductive pattern 258, a second barrier pattern 278, a second metal pattern 288, and the second gate mask 618 sequentially stacked on the second active pattern 108. The second and fifth conductive patterns 218 and 258 may include the same material, and thus may be merged with each other to form a second gate electrode 268.

A gate spacer 630 may be formed to cover a sidewall of the second gate structure 628, and impurities may be implanted into an upper portion of the second active pattern 108 adjacent the second gate structure 628 to form a source/drain layer 109.

After removing the second mask, a first insulating interlayer may be formed on the second and third regions II and III of the substrate 100, and may be planarized until the first metal layer 280 and the second gate mask 618 may be exposed to form a first insulating interlayer pattern 640 surrounding the second gate structure 628 and the gate spacer 630 on the third region III of the substrate 100. The first insulating interlayer pattern 640 may include an oxide, e.g., silicon oxide.

A capping layer 290 may be formed on the first metal layer 280, the first insulating interlayer pattern 640, and the second gate mask 618. The capping layer 290 may include a nitride, e.g., silicon nitride.

Figure 8:
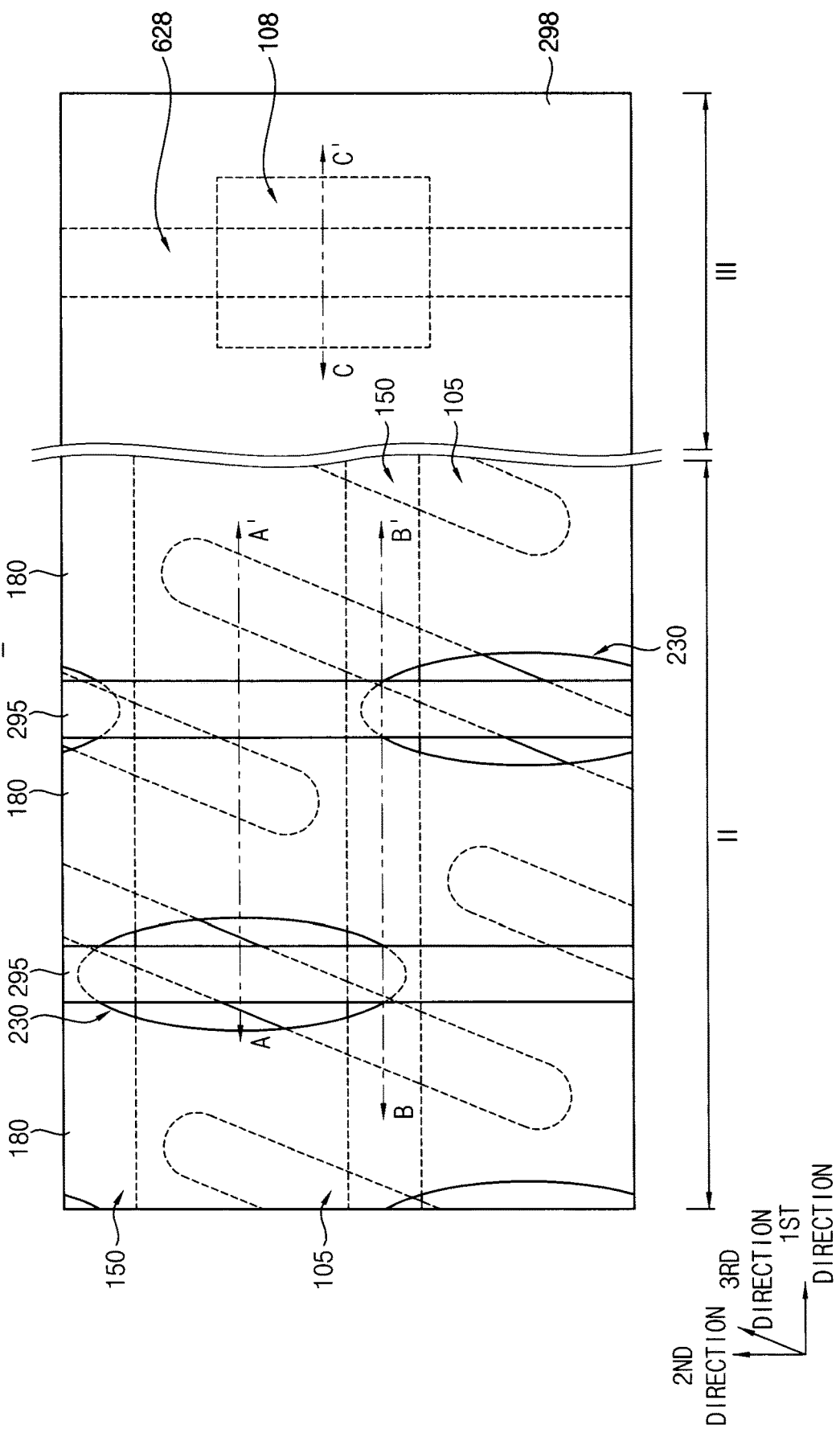
Figure 9:
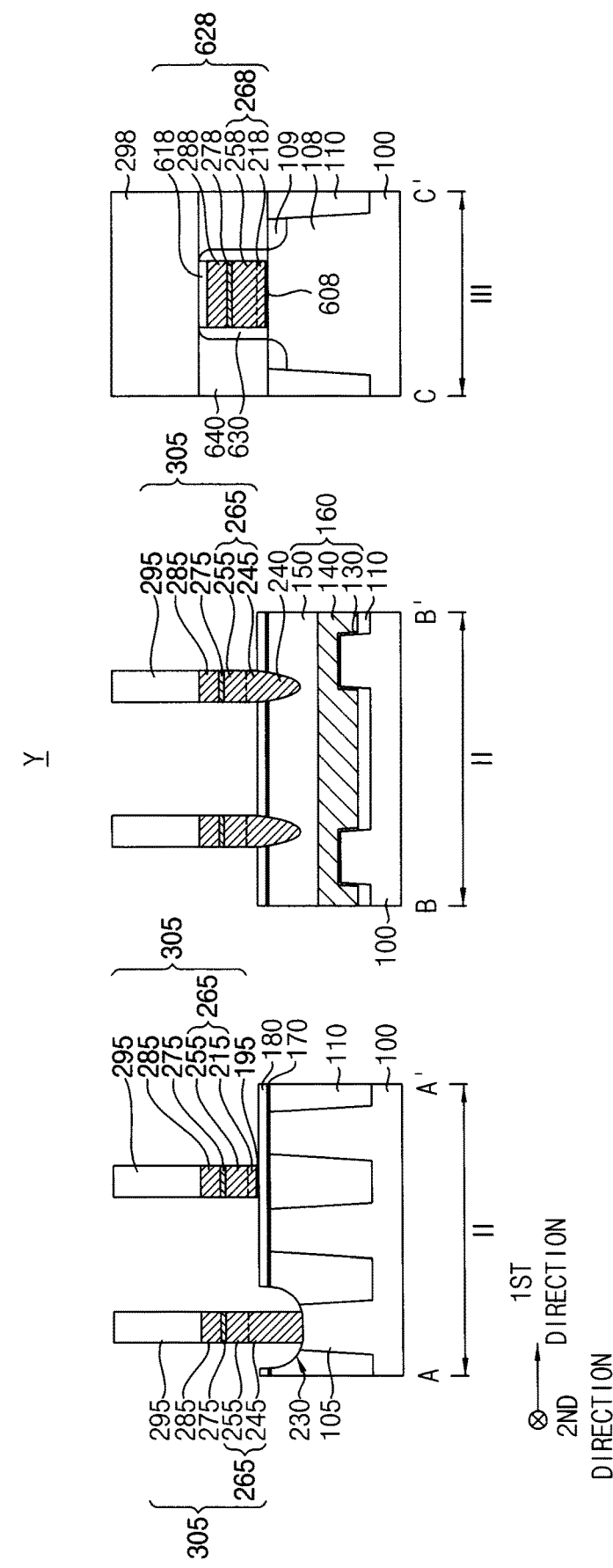

Referring to FIGS. 8 and 9, a portion of the capping layer 290 on the second region II of the substrate 100 may be etched to form a first capping pattern 295, and the first metal layer 280, the barrier layer 270, the third conductive layer 250, the first and second conductive layers 210 and 240, and the third insulation layer 190 may be sequentially etched using the first capping pattern 295 as an etching mask.

In example embodiments, the first capping pattern 295 may extend lengthwise in the second direction, and a plurality of first capping patterns 295 may be spaced apart from each other in the first direction on the second region II of the substrate 100. A portion of the capping layer 290 on the third region III of the substrate 100 may remain as a second capping pattern 298.

By the etching process, on the second region II of the substrate 100, a third conductive pattern 245, a fourth conductive pattern 255, a first barrier pattern 275, a first metal pattern 285, and the first capping pattern 295 may be sequentially stacked on the first active pattern 105, the isolation pattern 110, and the first gate mask 150 in the first opening 230, and a third insulation pattern 195, a first conductive pattern 215, the fourth conductive pattern 255, the first barrier pattern 275, the first metal pattern 285, and the first capping pattern 295 may be sequentially stacked on the second insulation layer 180 of the insulation layer structure 200 at an outside of the first opening 230.

As illustrated above, the first to third conductive layers 210, 240, and 250 may be merged with each other, and thus the third and fourth conductive patterns 245 and 255 sequentially stacked and the first and fourth conductive patterns 215 and 255 sequentially stacked may each form one first conductive structure 265. Hereinafter, the first conductive structure 265, the first barrier pattern 275, the first metal pattern 285, and the first capping pattern 295 sequentially stacked may be referred to as a bit line structure 305.

In example embodiments, the bit line structure 305 may extend lengthwise in the second direction on the second region II of the substrate 100, and a plurality of bit line structures 305 may be spaced apart from each other in the first direction.

Figure 10:
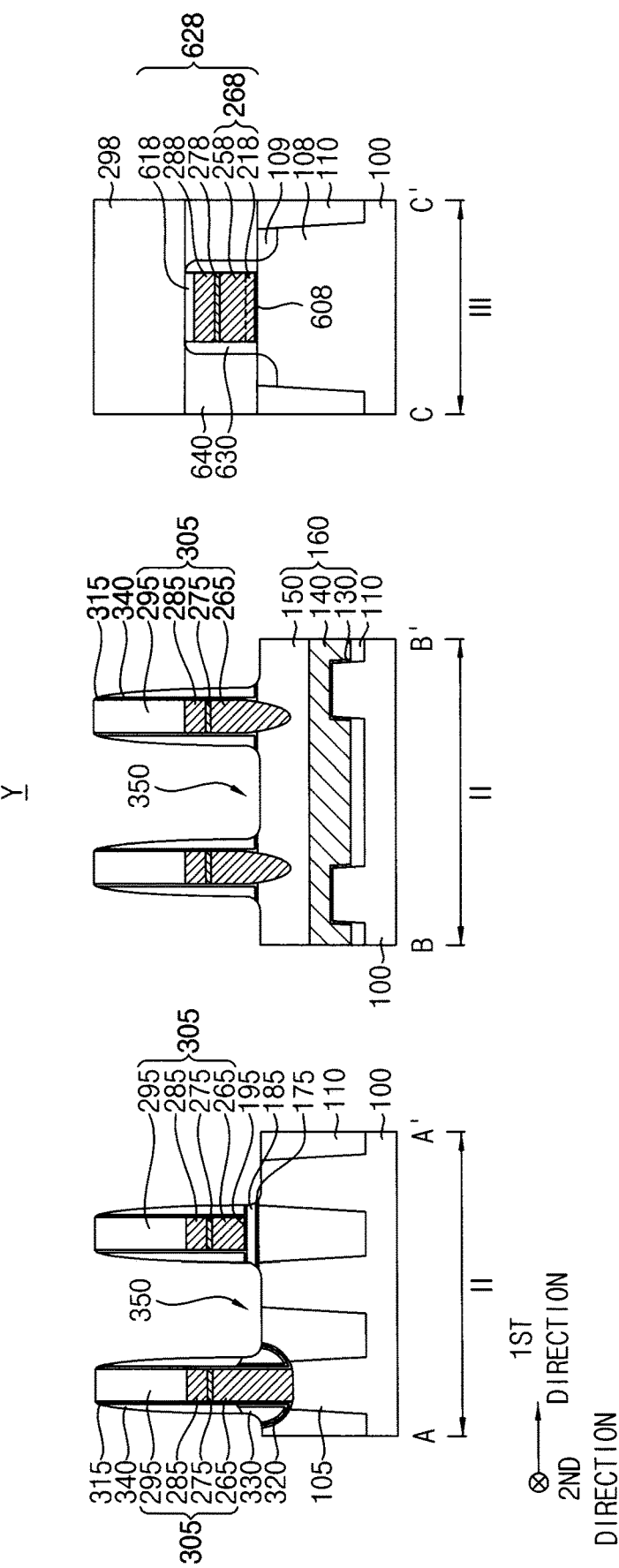

Referring to FIG. 10, a first spacer layer may be formed on upper surfaces of the first active pattern 105, the isolation pattern 10 and the first gate mask 150 exposed by the first opening 230, a sidewall of the first opening 230, the second insulation layer 180, and the second capping pattern 298 to cover the bit line structure 305, and fourth and fifth insulation layers may be sequentially formed on the first spacer layer.

The first spacer layer may also cover a sidewall of the third insulation pattern 195 between the second insulation layer 180 and the bit line structure 305, and the fifth insulation layer may fill the first opening 230.

The fourth and fifth insulation layers may be etched by an etching process. In example embodiments, the etching process may be performed by a wet etch process, and other portions of the fourth and fifth insulation layers except for a portion in the first opening 230 may be removed. Thus, most of an entire surface of the first spacer layer 310 (e.g., an entire surface except for a portion thereof in the first opening 230) may be exposed, and portions of the fourth and fifth insulation layers remaining in the first opening 230 may form fourth and fifth insulation patterns 320 and 330, respectively.

A second spacer layer may be formed on the exposed surface of the first spacer layer and the fourth and fifth insulation patterns 320 and 330 in the first opening 230, and may be anisotropically etched to form a second spacer 340 on the surface of the first spacer layer and the fourth and fifth insulation patterns 320 and 330 to cover a sidewall of the bit line structure 305.

A dry etching process may be performed using the first and second capping patterns 295 and 298 and the second spacer 340 as an etching mask to form a second opening 350 exposing the upper surface of the first active pattern 105. The upper surface of the isolation pattern 10 and the upper surface of the first gate mask 150 may be exposed by the second opening 350.

By the dry etching process, a portion of the first spacer layer on upper surfaces of the first and second capping patterns 295 and 298 and an upper surface of the second insulation layer 180 may be removed, and thus a first spacer 315 covering the sidewall of the bit line structure 305 may be formed. During the dry etching process, the first and second insulation layers 170 and 180 may be partially removed, such that first and second insulation patterns 175 and 185 may remain under the bit line structure 305. The first to third insulation patterns 175, 185, and 195 that are sequentially stacked under the bit line structure 305 may form an insulation pattern structure.

Figure 11:
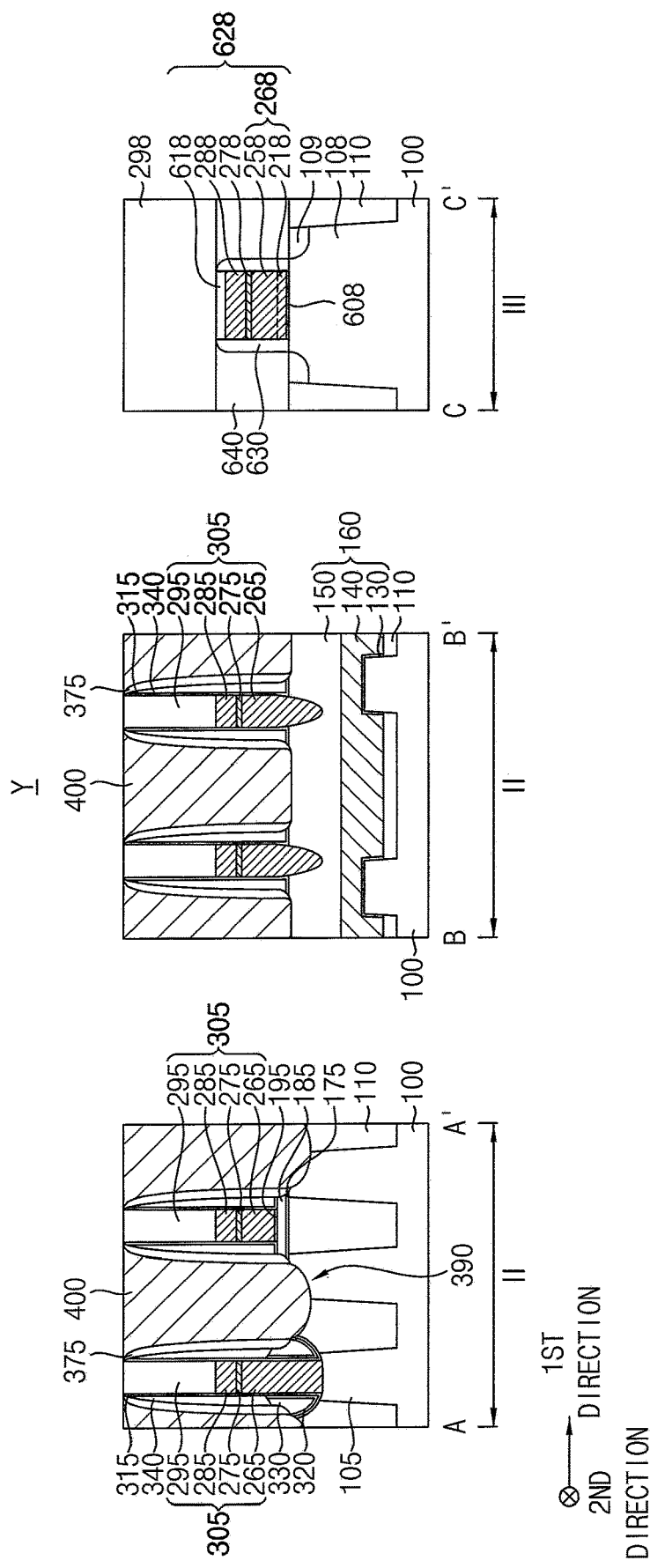

Referring to FIG. 11, a third spacer layer may be formed on the upper surfaces of the first and second capping patterns 295 and 298, an outer sidewall of the second spacer 340, portions of upper surfaces of the fourth and fifth insulation patterns 320 and 330, and the upper surfaces of the first active pattern 105, the isolation pattern 110 and the first gate mask 150 exposed by the second opening 350, and a third mask (not shown) covering the third region III of the substrate 100, and the third mask may be anisotropically etched to form a third spacer 375 covering the sidewall of the bit line structure 305.

The third spacer layer may include a nitride, e.g., silicon nitride, and may be merged with the second capping pattern 298. Additionally, the third mask may include a material having an etching selectivity with respect to the third spacer layer, e.g., photoresist pattern.

The first to third spacers 315, 340, and 375 sequentially stacked in a horizontal direction substantially parallel to the upper surface of the substrate 100 from the sidewall of the bit line structure 305 on the second region II of the substrate 100 may be referred to as a preliminary spacer structure.

The third mask may be removed by, e.g., an ashing process and/or a stripping process, and an upper portion of the first active pattern 105 may be removed by an etching process to form a fourth recess 390 connected to the second opening 350.

A lower contact plug layer 400 may be formed to fill the second opening 350 and the fourth recess 390 on the second region II of the substrate 100, and may be planarized until the upper surfaces of the first and second capping patterns 295 and 298 may be exposed.

In example embodiments, the lower contact plug layer 400 may extend lengthwise in the second direction, and a plurality of lower contact plug layers 400 may be formed to be spaced apart from each other in the first direction by the bit line structures 305.

Figure 12:
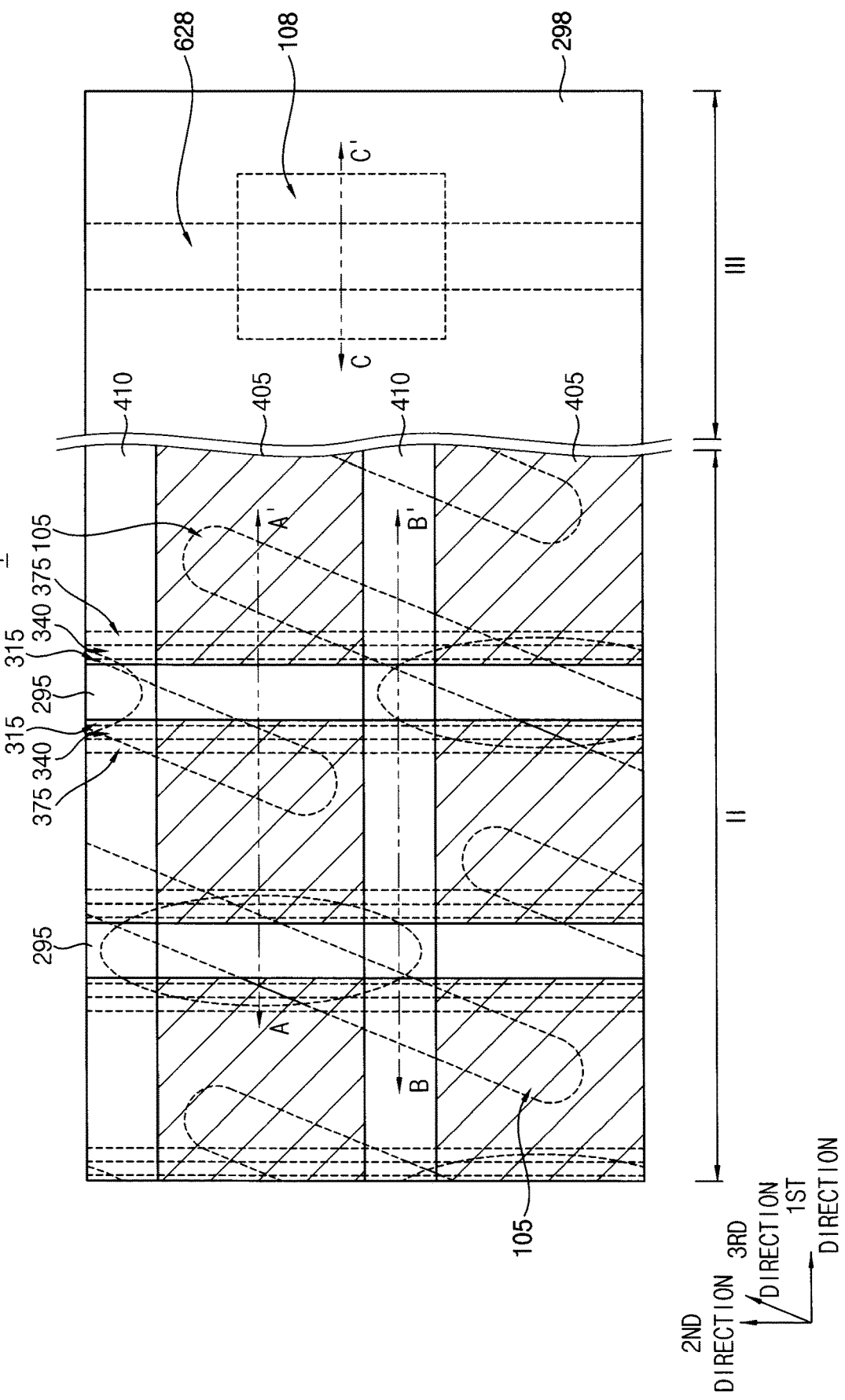
Figure 13:
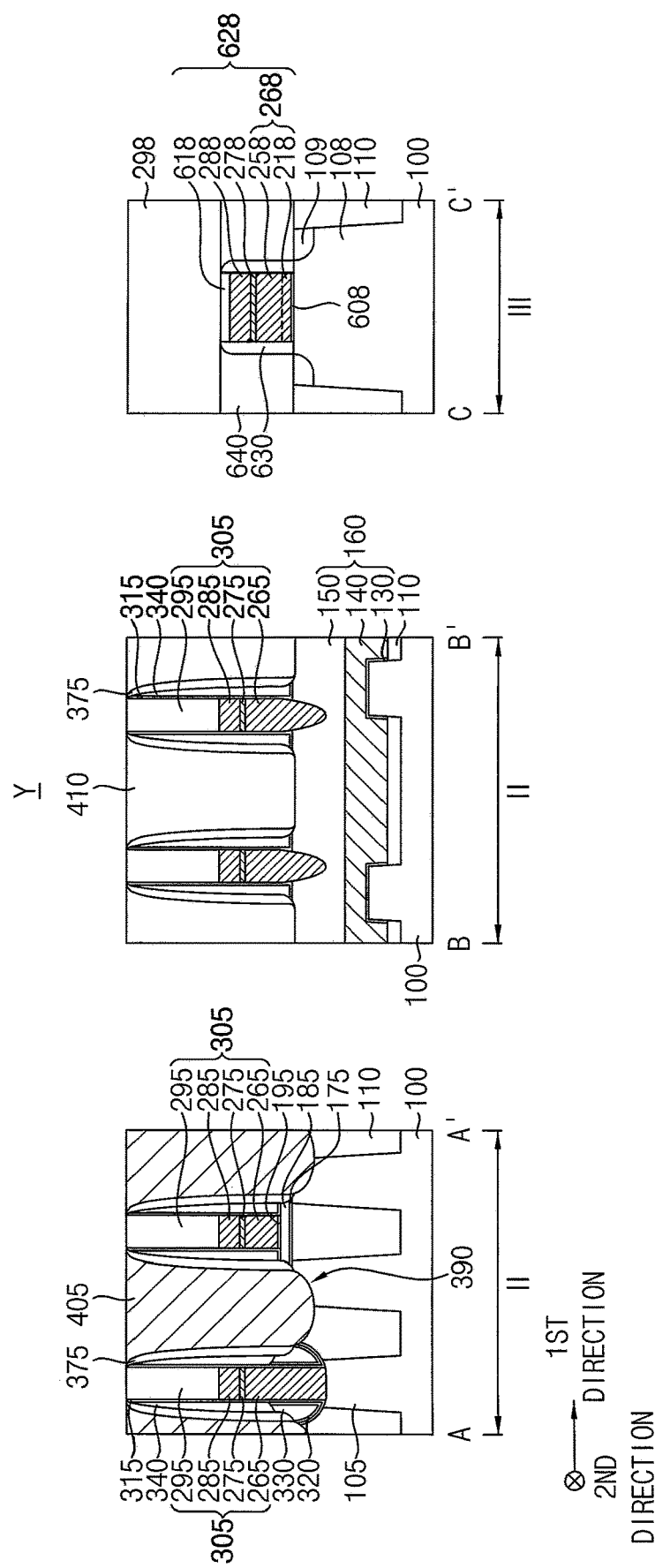

Referring to FIGS. 12 and 13, a fourth mask (not shown) including third openings, each of which may extend in the first direction and be spaced apart from each other in the second direction, may be formed on the first and second capping patterns 295 and 298 and the lower contact plug layer 400 on the second region II of the substrate 100, and the lower contact plug layer 400 may be etched using the fourth mask as an etching mask.

In example embodiments, each of the third openings may overlap the first gate structure 160 in a vertical direction substantially perpendicular to the upper surface of the substrate 100. By the etching process, a fourth opening may be formed to expose the upper surface of the first gate mask 150 of the first gate structure 160 between the bit line structures 305 on the second region II of the substrate 100.

After removing the fourth mask, a third capping pattern 410 may be formed on the second region II of the substrate 100 to fill the fourth opening. The third capping pattern 410 may include a nitride, e.g., silicon nitride. In example embodiments, the third capping pattern 410 may extend in the first direction between the bit line structures 305, and a plurality of third capping patterns 410 may be formed in the second direction.

Thus, the lower contact plug layer 400 extending in the second direction between the bit line structures 305 may be divided into a plurality of lower contact plugs 405 spaced apart from each other in the second direction by the third capping patterns 410 on the second region II of the substrate 100.

Figure 14:
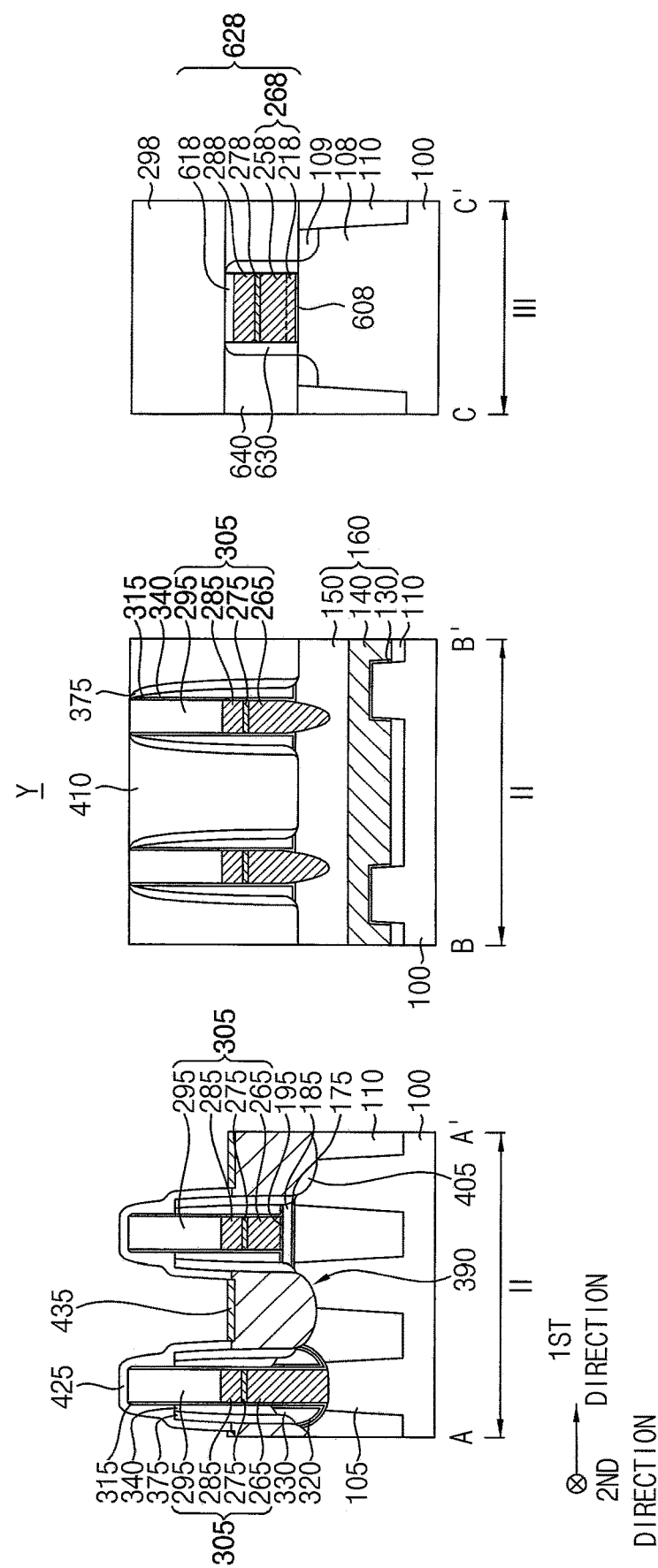

Referring to FIG. 14, an upper portion of the lower contact plug 405 may be removed to expose an upper portion of the preliminary spacer structure on the sidewall of the bit line structure 305, and upper portions of the second and third spacers 340 and 375 of the exposed preliminary spacer structure may be removed.

An upper portion of the lower contact plug 405 may be further removed. Thus, an upper surface of the lower contact plug 405 may be at a lower vertical level than uppermost surfaces of the second and third spacers 340 and 375.

A fourth spacer layer may be formed on the bit line structure 305, the preliminary spacer structure, the second and third capping patterns 298 and 410, and the lower contact plug 405, and may be anisotropically etched so that a fourth spacer 425 may be formed to cover the first to third spacers 315, 340, and 375 on each of opposite sidewalls of the bit line structure 305 in the first direction and that an upper surface of the lower contact plug 405 may be exposed.

A metal silicide pattern 435 may be formed on the exposed upper surface of the lower contact plug 405. An upper surface of the metal silicide pattern 435 may be at a lower vertical level than uppermost surfaces of the second and third spacers 340 and 375. In example embodiments, the metal silicide pattern 435 may be formed by forming a second metal layer on the first to third capping patterns 295, 298, and 410, the fourth spacer 425, and the lower contact plug 405, thermally treating the second metal layer, and removing unreacted portion of the second metal layer. The metal silicide pattern 435 may include, e.g., cobalt silicide, nickel silicide, titanium silicide, etc.

Figure 15:
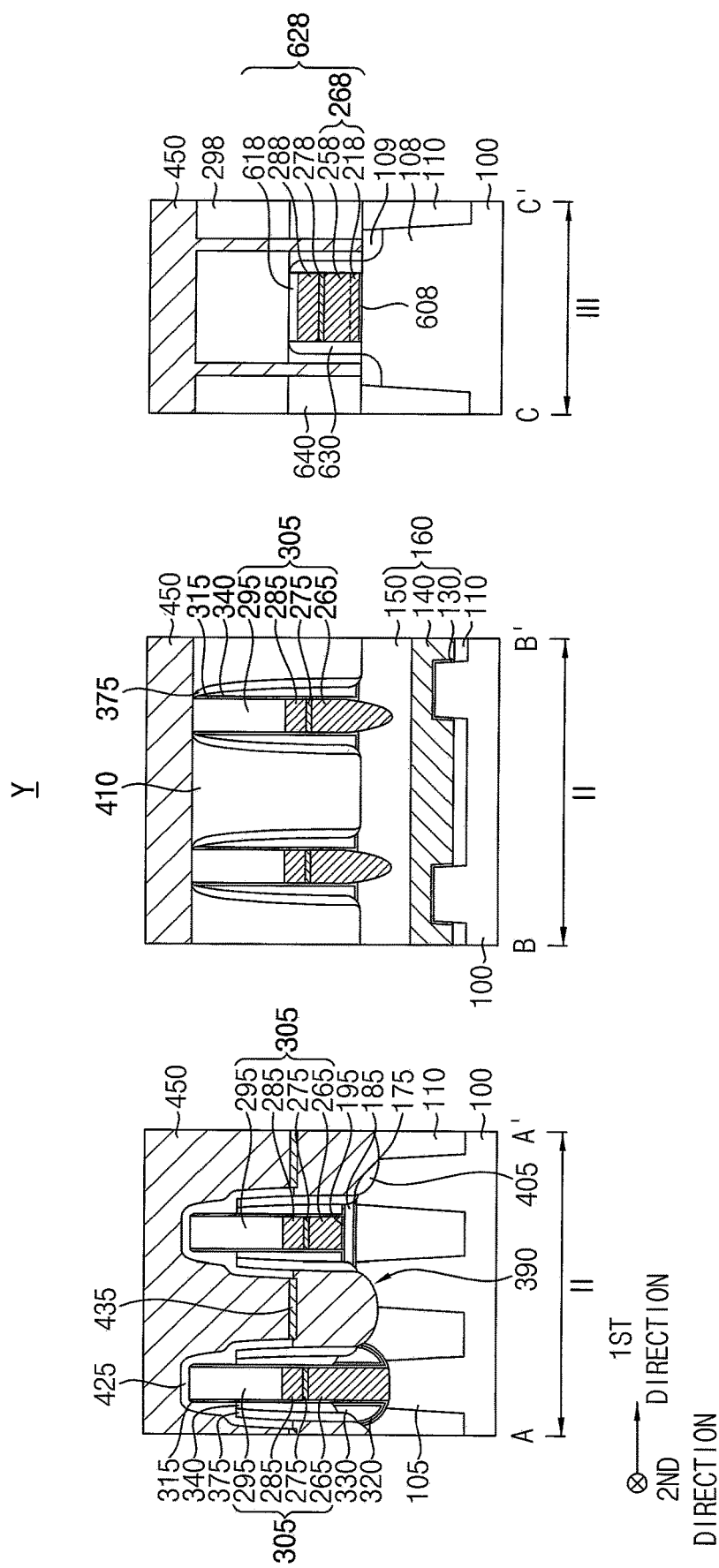

Referring to FIG. 15, a first sacrificial layer may be formed on the first to third capping patterns 295, 298, and 410, the metal silicide pattern 435, and the lower contact plug 405, the first sacrificial layer may be planarized until the upper surfaces of the first to third capping patterns 295, 298, and 410 may be exposed, and a first hole may be formed on the third region III of the substrate 100.

The first sacrificial layer may include, e.g., silicon-on-hardmask (SOH), amorphous carbon layer (ACL), etc.

The first hole may extend vertically through the second capping pattern 298 and the first insulating interlayer pattern 640 to expose an upper surface of the source/drain layer 109 on the third region III of the substrate 100.

After removing the first sacrificial layer, an upper contact plug layer 450 may be formed on the first to third capping patterns 295, 298, and 410, the first to fourth spacers 315, 340, 375, and 425, the metal silicide pattern 435, the lower contact plug 405, and the source/drain layer 109, and the upper contact plug layer 450 may be planarized.

In example embodiments, an upper surface of the upper contact plug layer 450 may be at a higher vertical level than those of the first to third capping patterns 295, 298, and 410.

Figure 16:
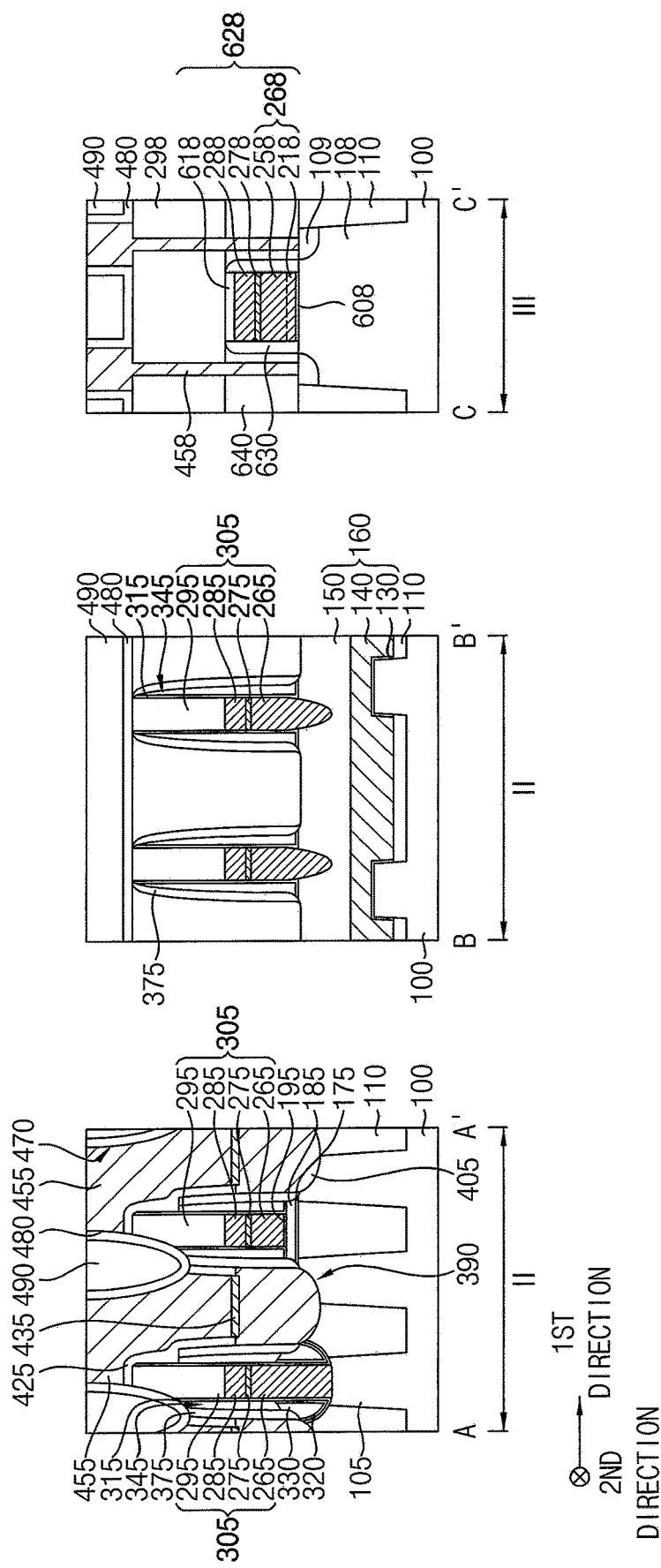

Referring to FIG. 16, a second hole 470 may be formed on the second region II of the substrate 100, and the upper contact plug layer 450 may be patterned on the third region III of the substrate 100.

The second hole 470 may be formed by removing an upper portion of the upper contact plug layer 450, an upper portion of the first capping pattern 295, and upper portions of the first, third, and fourth spacers 315, 375, and 425. The second hole 470 may expose an upper surface of the second spacer 340.

As the second hole 470 is formed, the upper contact plug layer 450 may be divided into a plurality of upper contact plugs 455 on the second region II of the substrate 100. In example embodiments, the plurality of upper contact plugs 455 may be formed in the first and second directions, and may be arranged in a honeycomb pattern in a plan view. Each of the upper contact plugs 455 may have a shape of a circle, an ellipse, or a polygon in the plan view.

The lower contact plug 405, the metal silicide pattern 435, and the upper contact plug 455 sequentially stacked on the second region II of the substrate 100 may form a contact plug structure.

The upper contact plug layer 450 may be patterned on the third region III of the substrate 100 to form a first contact plug 458, which may be electrically connected to the source/drain layer 109.

The exposed second spacer 340 may be removed to form an air gap 345 connected to the second hole 470. The second spacer 340 may be removed by, e.g., a wet etching process.

In example embodiments, not only a portion of the second spacer 340 directly exposed by the second hole 470 but also other portions of the second spacer 340 parallel to the directly exposed portion thereof in the horizontal direction may be removed. For example, in addition to the portion of the second spacer 340 exposed by the second hole 470 and not to be covered by the upper contact plug 455, a portion of the second spacer 340 adjacent to the exposed portion in the second direction to be covered by the third capping pattern 410 and a portion of the second spacer 340 adjacent to the exposed portion in the second direction to be covered by the upper contact plug 455 may be removed.

Second and third insulating interlayers 480 and 490 may be sequentially stacked to fill the second hole 470 on the second region II of the substrate 100 and a space between the first contact plugs 458 on the third region III of the substrate 100. The second and third insulating interlayers 480 and 490 may be also sequentially stacked on the third capping pattern 410.

The second insulating interlayer 480 may include a material having a low gap filling characteristic, and thus the air gap 345 under the second hole 470 may not be filled. The air gap 345 may be also referred to as an air spacer 345, and may form a spacer structure together with the first, third, and fourth spacers 315, 375, and 425. For example, the air gap 345 may be a spacer including an air. The term "air" as discussed herein, may refer to atmospheric air, or other gases that may be present during the manufacturing process.

Figure 17:
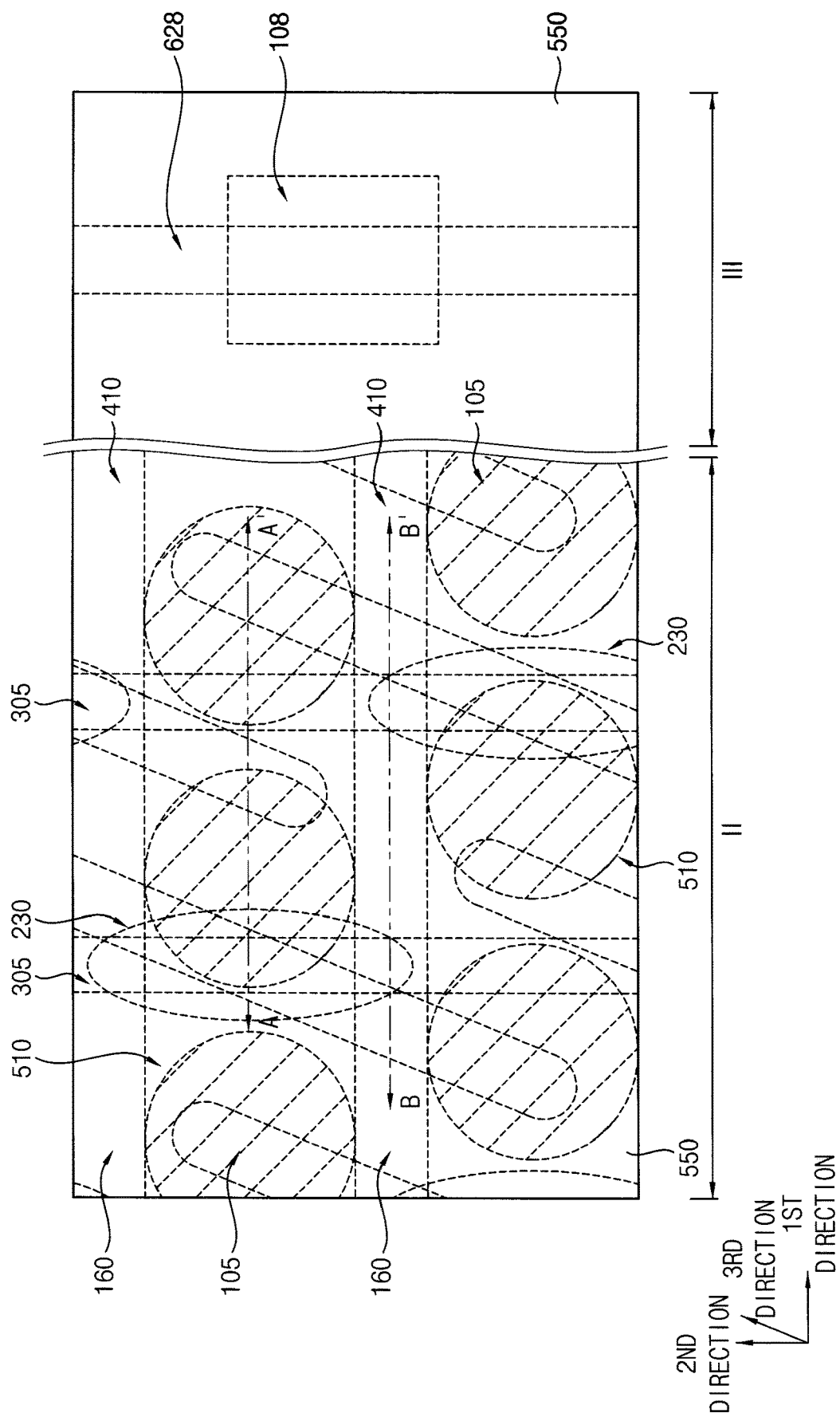
Figure 18:
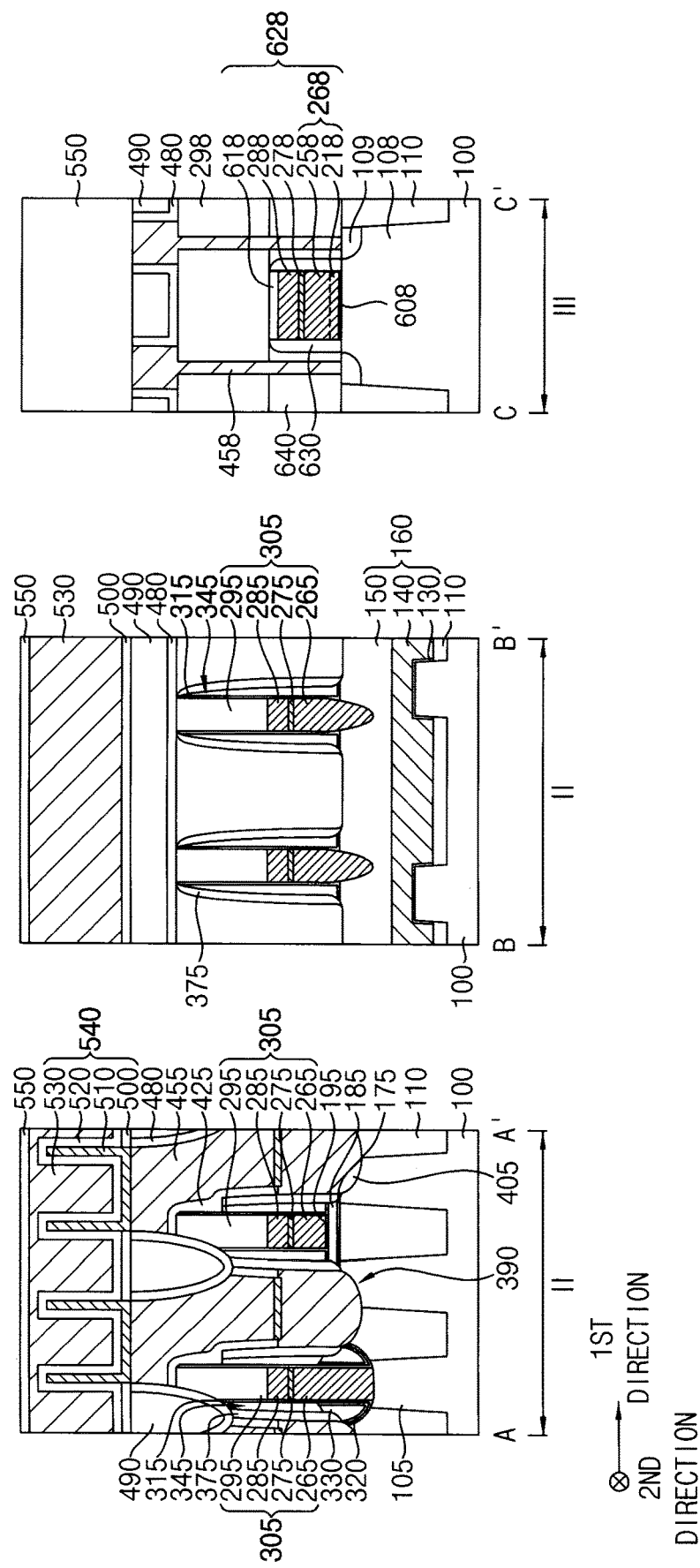

Referring to FIGS. 17 and 18, a capacitor 540 may be formed to contact the upper surface of the upper contact plug 455.

Particularly, a first etch stop layer 500 and a mold layer (not shown) may be sequentially formed on the upper contact plug 455, the second and third insulating interlayers 480 and 490, and the first contact plug 458, and the first etch stop layer 500 and a mold layer may be partially etched to form a fifth opening partially exposing the upper surface of the upper contact plug 455.

A lower electrode layer (not shown) may be formed on a sidewall of the fifth opening, the exposed upper surface of the upper contact plug 455, and the mold layer, and a second sacrificial layer (not shown) may be formed on the lower electrode layer to fill the fifth opening. The lower electrode layer and the second sacrificial layer may be planarized until an upper surface of the mold layer may be exposed to divide the lower electrode layer. The second sacrificial layer and the mold layer may be removed by, e.g., a wet etching process, and thus a lower electrode 510 having a cylindrical shape (in plan view) may be formed on the exposed upper surface of the upper contact plug 455. Alternatively, the lower electrode 510 may have a pillar shape filling the fifth opening.

A dielectric layer 520 may be formed on a surface of the lower electrode 510 and the first etch stop layer 500, and an upper electrode 530 may be formed on the dielectric layer 520 so that the capacitor 540 including the lower electrode 510, the dielectric layer 520, and the upper electrode 530 may be formed.

A fourth insulating interlayer 550 may be formed to cover the capacitor 540. The fourth insulating interlayer 550 may be formed on the second and third regions II and III of the substrate 100. The fourth insulating interlayer 550 may include an oxide, e.g., silicon oxide.

As mentioned above, hereinafter, it is assumed that the elements on the third region III of the substrate 100 have been also formed on the fourth region IV of the substrate 100, and structures that may be formed on the second to fourth regions II, III and IV of the substrate 100 will be illustrated.

Figure 19:
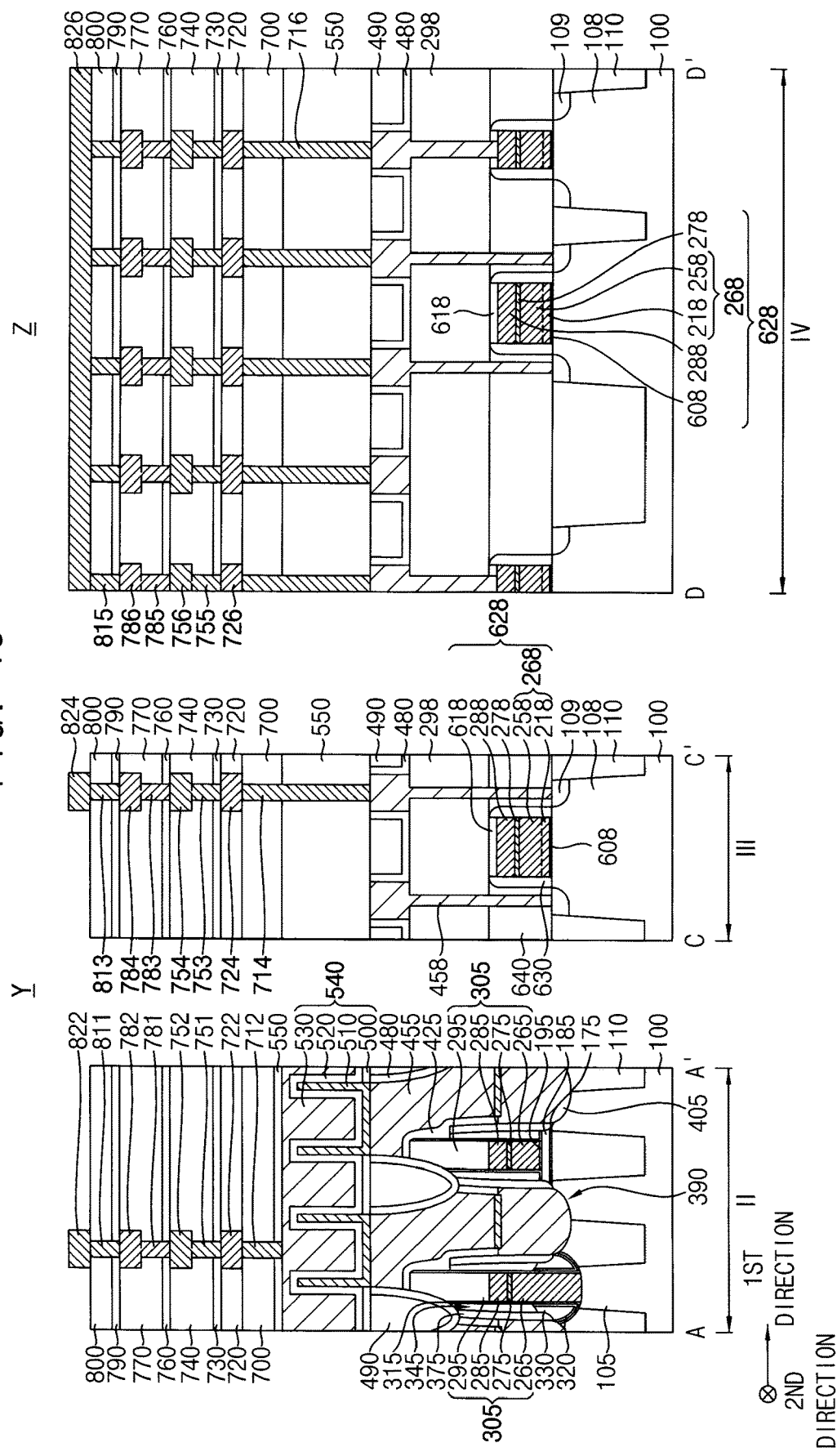

Referring to FIG. 19, a fifth insulating interlayer 700 may be formed on the fourth insulating interlayer 550 A second contact plug 712 may be formed to extend vertically through the fourth and fifth insulating interlayers 550 and 700 to contact the capacitor 540 on the second region II of the substrate 100, and third and fourth contact plugs 714 and 716 may be formed to extend vertically through the fourth and fifth insulating interlayers 550 and 700 to contact the first contact plugs 458 on the third and fourth regions III and IV, respectively, of the substrate 100. The fifth insulating interlayer 700 may include a silicon oxide, e.g., tetraethyl orthosilicate (TEOS).

A sixth insulating interlayer 720 may be formed on the fifth insulating interlayer 700 and the second to fourth contact plugs 712, 714, and 716, and first to third wirings 722, 724, and 726 may be formed to extend vertically through the sixth insulating interlayer 720 to contact the second to fourth contact plugs 712, 714, and 716, respectively.

A second etch stop layer 730 and a seventh insulating interlayer 740 may be sequentially formed on the sixth insulating interlayer 720 and the first to third wirings 722, 724, and 726. First to third vias 751, 753, and 755 may be formed to extend vertically through the second etch stop layer 730 and a lower portion of the seventh insulating interlayer 740 to contact the first to third wirings 722, 724, and 726, respectively, and fourth to sixth wirings 752, 754, and 756 may be formed to extend through an upper portion of the seventh insulating interlayer 740 to contact the first to third vias 751, 753, and 755, respectively. In example embodiments, the first to third vias 751, 753, and 755 and the fourth to sixth wirings 752, 754, and 756 may be formed simultaneously by a dual damascene process, however, the inventive concept may not be limited thereto, and each may be independently formed by a single damascene process.

A third etch stop layer 760 and an eighth insulating interlayer 770 may be sequentially formed on the seventh insulating interlayer 740 and the fourth to sixth wirings 752, 754, and 756. Fourth to sixth vias 781, 783, and 785 may be formed to extend vertically through the third etch stop layer 760 and a lower portion of the eighth insulating interlayer 770 to contact the fourth to sixth wirings 752, 754, and 756, respectively, and seventh to ninth wirings 782, 784, and 786 may be formed to extend through an upper portion of the eighth insulating interlayer 770 to contact the fourth to sixth vias 781, 783, and 785, respectively.

A fourth etch stop layer 790 and a ninth insulating interlayer 800 may be sequentially formed on the eighth insulating interlayer 770 and the seventh to ninth wirings 782, 784, and 786. Seventh to ninth vias 811, 813, and 815 may be formed to extend vertically through the fourth etch stop layer 790 and the ninth insulating interlayer 800 to contact the seventh to ninth wirings 782, 784, and 786, respectively, and tenth to twelfth wirings 822, 824, and 826 may be formed on the ninth insulating interlayer 800 to contact the seventh to ninth vias 811, 813, and 815, respectively.

In example embodiments, each of the sixth to eighth insulating interlayers 720, 740, and 770 may include a low-k dielectric material. e.g., silicon oxide doped with fluorine or carbon, porous silicon oxide (SiOCH), spin on organic polymer, an inorganic polymer such as HSSQ, MSSQ, etc., each of the second to fourth etch stop layers 730, 760, and 790 may include, e.g., silicon carbonitride (SiCN), and the ninth insulating interlayer 800 may include an oxide, e.g., TEOS. In some embodiments, the second to fourth etch stop layers 730, 760, and 790 and the sixth to eighth insulating interlayers 720, 740, and 770 may be referred to as an insulating interlayer structure, and the ninth insulating interlayer 800 may include a material that has a dielectric constant greater than that of the insulating interlayer structure.

Figure 20:
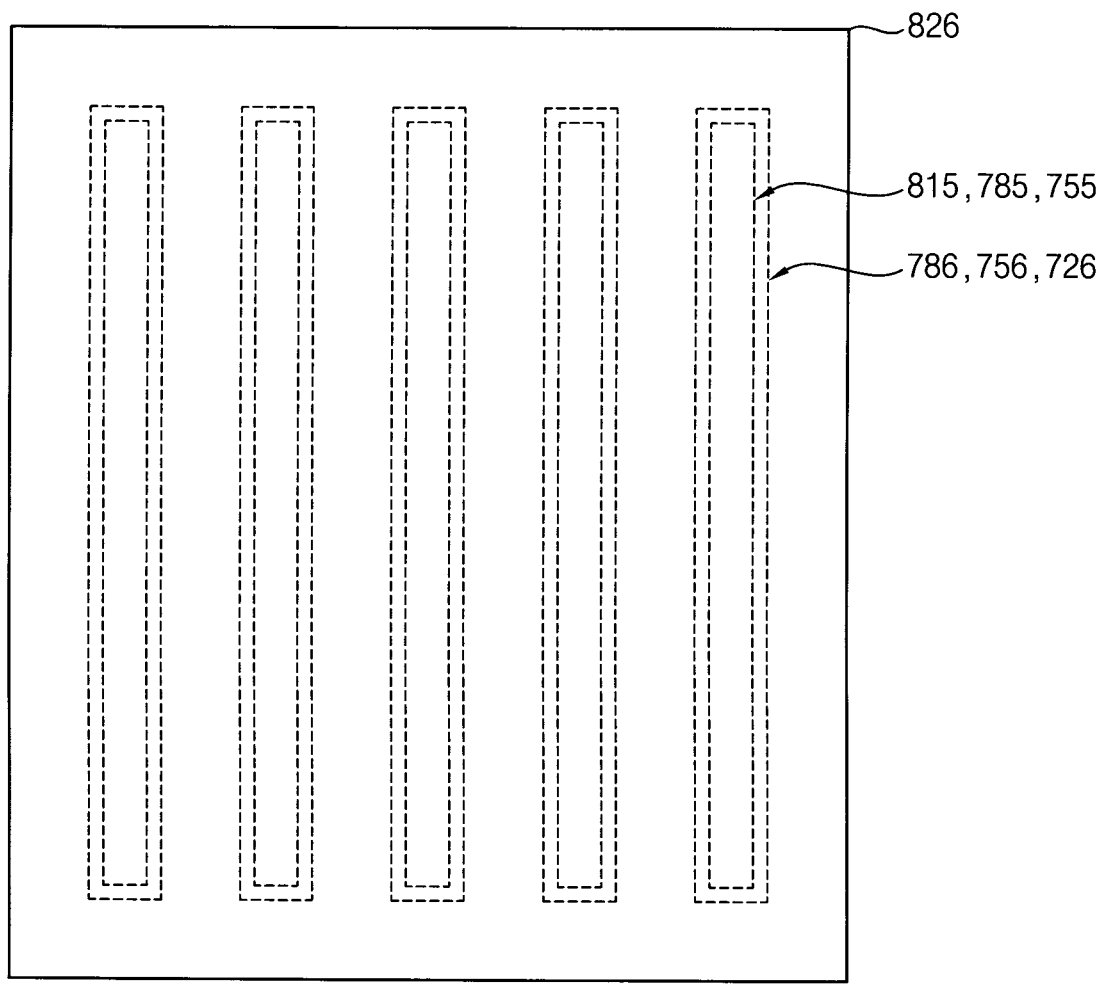

FIG. 20 is a plan view illustrating layouts of wirings and vias in the region Z in accordance with example embodiments.

Further referring to FIGS. 19 and 20, when viewed in plan view, each of the third, sixth, and ninth wirings 726, 756, and 786 and each of the third, sixth, and ninth vias 755, 785, and 815 may have a bar shape extending lengthwise in the second direction, and the twelfth wiring 826 thereon may have a shape of a polygon such as a rectangle, or a circle, or an ellipse. FIG. 20 shows the twelfth wiring 826 having a shape of a rectangle.

As illustrated above, a TEG, an alignment key, etc., may be formed on the fourth region IV of the substrate 100, and a pad of the TEG may be formed on the region Z of the IV region of the substrate 100. The twelfth wiring 826, which may be formed at an uppermost level on the region Z, may have a polygonal or circular shape, so that probes for applying voltage to the TEG may easily contact the TEG. The third, sixth, and ninth wirings 726, 756, and 786 under the twelfth wiring 826 may not directly contact the probe, and thus may not have the polygonal or circular shape but may have a bar shape extending in the second direction.

Each of the third, sixth, and ninth vias 755, 785, and 815 that may be formed between the third, sixth, ninth, and twelfth wirings 726, 756, 786, and 826 may also have a bar shape extending in the second direction.

In example embodiments, the third, sixth, and ninth wirings 726, 756, and 786, and the third, sixth, and ninth vias 755, 785, and 815 may overlap in the vertical direction, and thus may form a second conductive structure extending in the second direction and in the vertical direction. Each second conductive structure may be substantially perpendicular to an upper surface of the substrate 100. For example, when viewed in cross-section, a vertical central axis of each of the third, sixth, and ninth wirings 726, 756, and 786 and the third and sixth vias 755 and 785 may extend in a direction that is substantially perpendicular to the top surface of the substrate. In some embodiments, when viewed in cross-section, the vertical central axes of each of the third, sixth, and ninth wirings 726, 756, and 786 and the third and sixth vias 755 and 785 may be substantially aligned with one another.

In some embodiments, the third, sixth, and ninth wirings 726, 756, and 786 and the third and sixth vias 755 and 785 may be referred to as a conductive structure. For example, each conductive structure formed on a portion of the scribe lane region adjacent to the first edge E1 of the substrate 100 may include the third, sixth, and ninth wirings 726, 756, and 786 and the third and sixth vias 755 and 785. Each of the ninth vias 815 may be formed to extend through the ninth insulating interlayer 800 to contact a corresponding one of the conductive structures including the third, sixth, and ninth wirings 726, 756, and 786 and the third and sixth vias 755 and 785, and the twelfth wiring 826 may be formed on the upper surfaces of the ninth insulating interlayer 800 and the ninth vias 815, commonly contacting the upper surfaces of the ninth vias 815.

Each of the third, sixth, ninth, and twelfth wirings 726, 756, 786, and 826 may have an area greater than that of each of the third, sixth, and ninth vias 755, 785, and 815, when viewed in plan view; however, the inventive concept may not be limited thereto.

Figure 21:
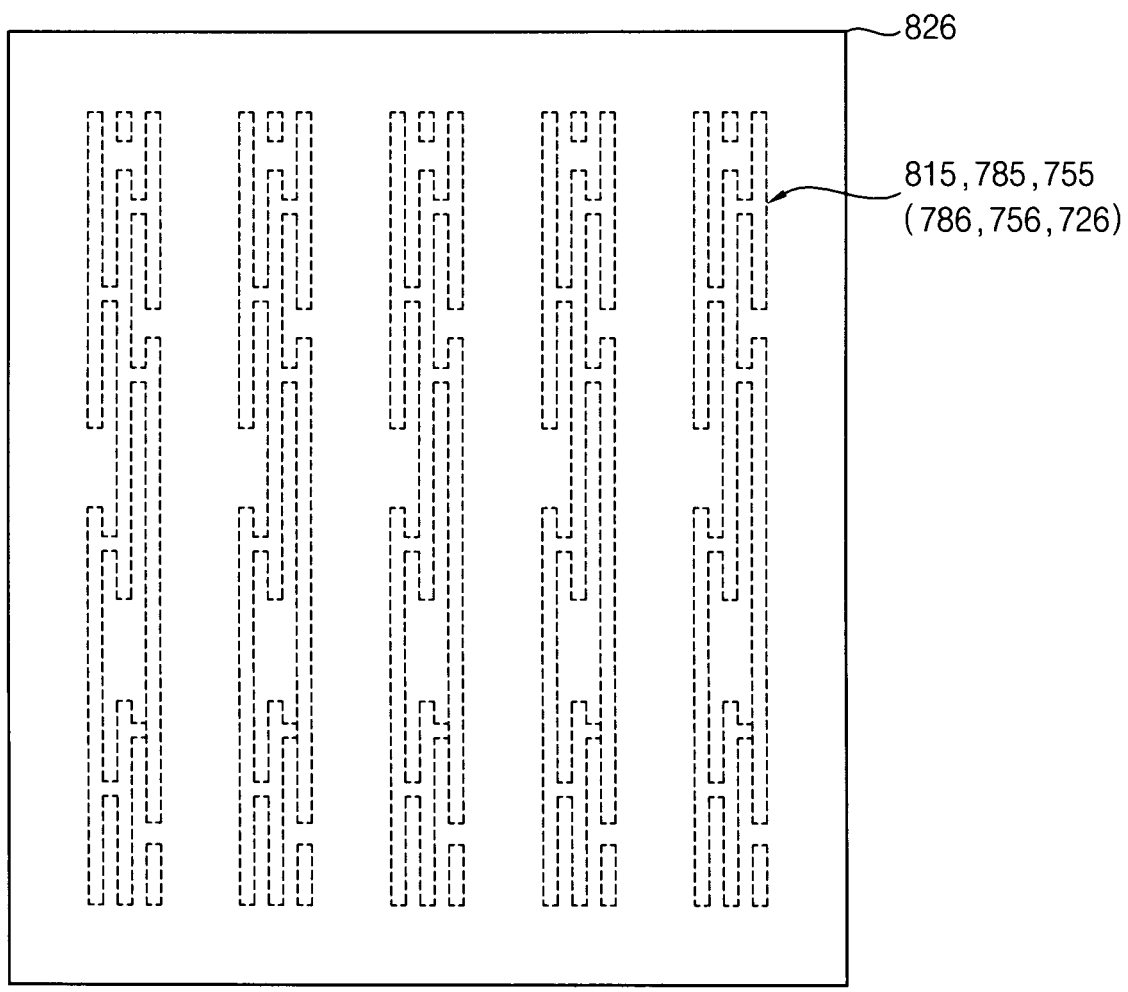
Figure 22:
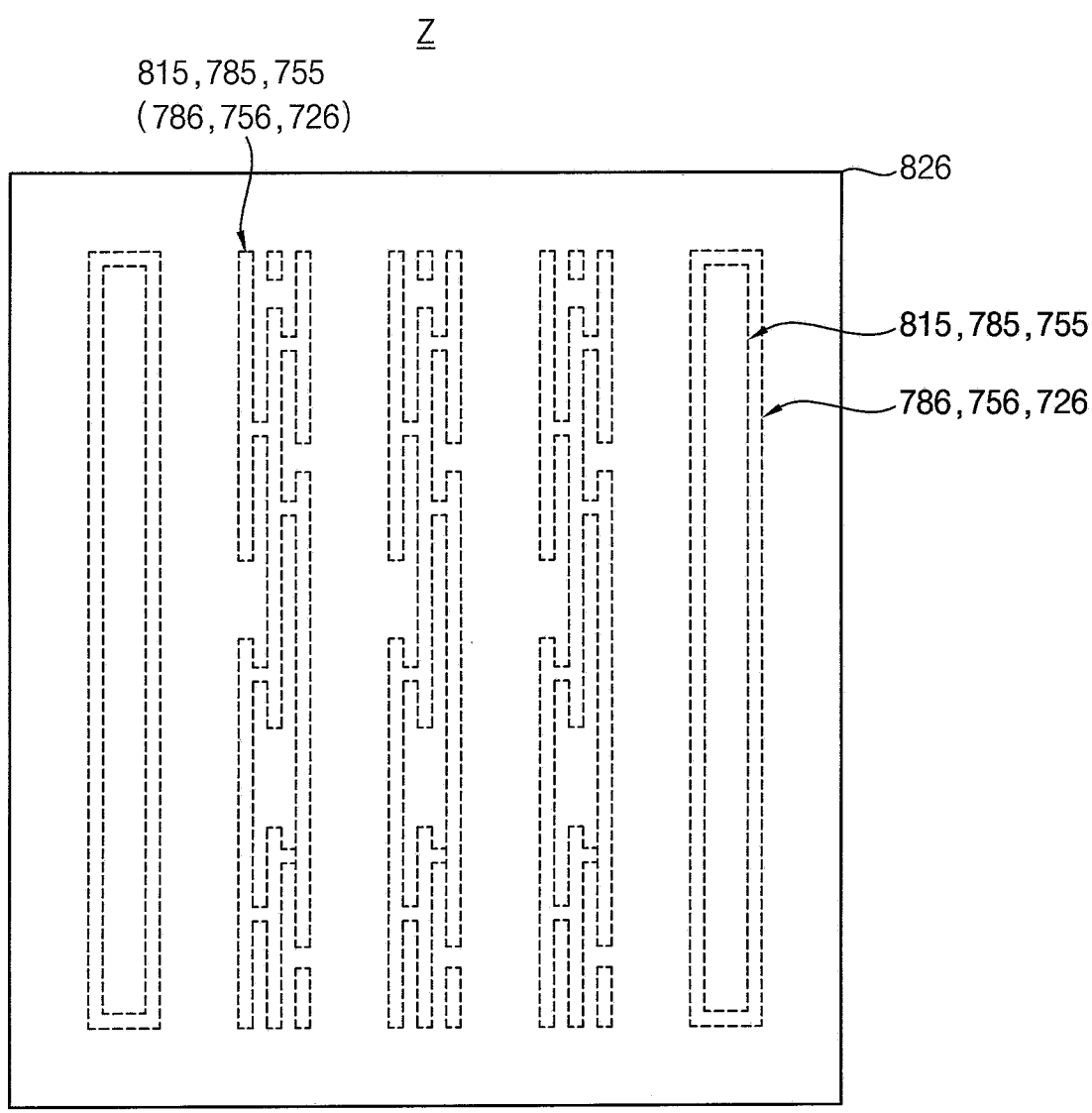

FIGS. 21 and 22 are plan views illustrating layouts of wirings and vias in accordance with example embodiments.

Referring to FIG. 21, each of the third, sixth, and ninth wirings 726, 756, and 786 and the third, sixth, and ninth vias 755, 785, and 815 may have a mesh structure extending in the second direction.

The mesh structure may include first extension portions, each of which may extend lengthwise in the second direction, connected with each other by second extension portions, each of which may extend lengthwise in the first direction, and a material may not move from one side of the mesh structure to the other side thereof through the mesh structure in the first direction.

Referring to FIG. 22, some of the third, sixth, and ninth wirings 726, 756, and 786 and the third, sixth, and ninth vias 755, 785, and 815 may have a bar shape extending in the second direction, and others of the third, sixth, and ninth wirings 726, 756, and 786 and the third, sixth, and ninth vias 755, 785, and 815 may have a mesh structure extending in the second direction. FIG. 22 shows each of ones of the wirings and the vias at opposite ends in the first direction has a bar shape, and each of ones of the wirings and the vias in the middle has a mesh structure.

Figure 23:
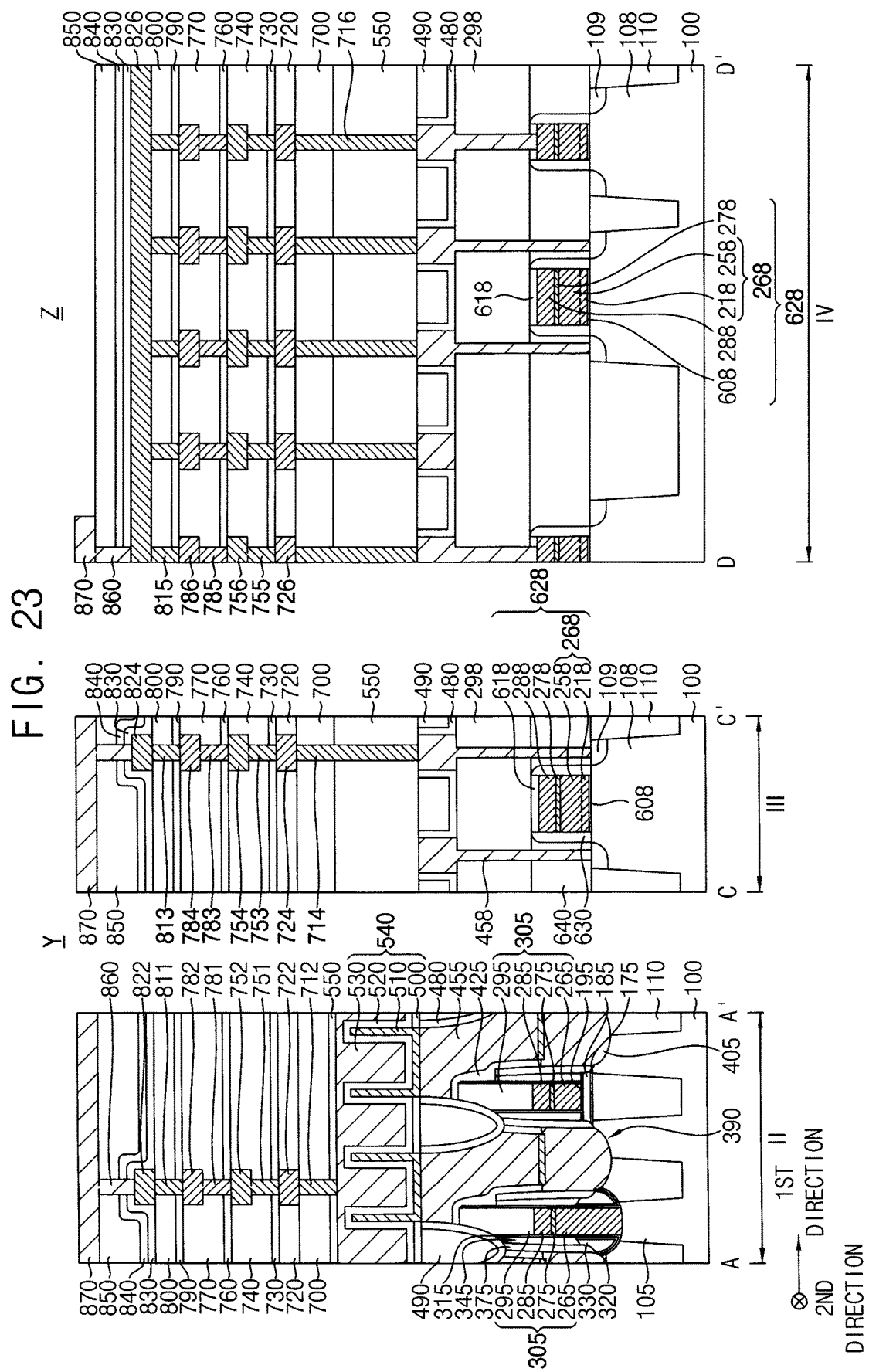

Referring to FIG. 23, a first protection layer structure may be formed on the tenth to twelfth wirings 822, 824, and 826 and the ninth insulating interlayer 800, and tenth vias 860 may be formed to extend vertically through the first protection layer structure to contact the tenth to twelfth wirings 822, 824, and 826. A redistribution layer 870 may be formed on the first protection layer and may contact upper surfaces of the tenth vias 860.

In example embodiments, the first protection layer structure may include a first oxide layer 830, a nitride layer 840, and a second oxide layer 850 sequentially stacked. The redistribution layer 870 may contact a top surface of the second oxide layer 850.

The redistribution layer 870 may be formed on the second and third regions II and III of the substrate 100, and may be formed on only an edge portion of the fourth region IV of the substrate 100. The redistribution layer 870 may include, e.g., a seed layer and a third metal layer sequentially stacked. The seed layer may include a metal, e.g., copper, ruthenium, nickel, gold, tungsten, etc., and may be formed by, e.g., a physical vapor deposition (PVD). The third metal layer may be formed by a plating process using a plating solution including electrolyte solution containing a metal ion, e.g., copper ion, ruthenium ion, nickel ion, gold ion, tungsten ion, etc.

Figure 24:
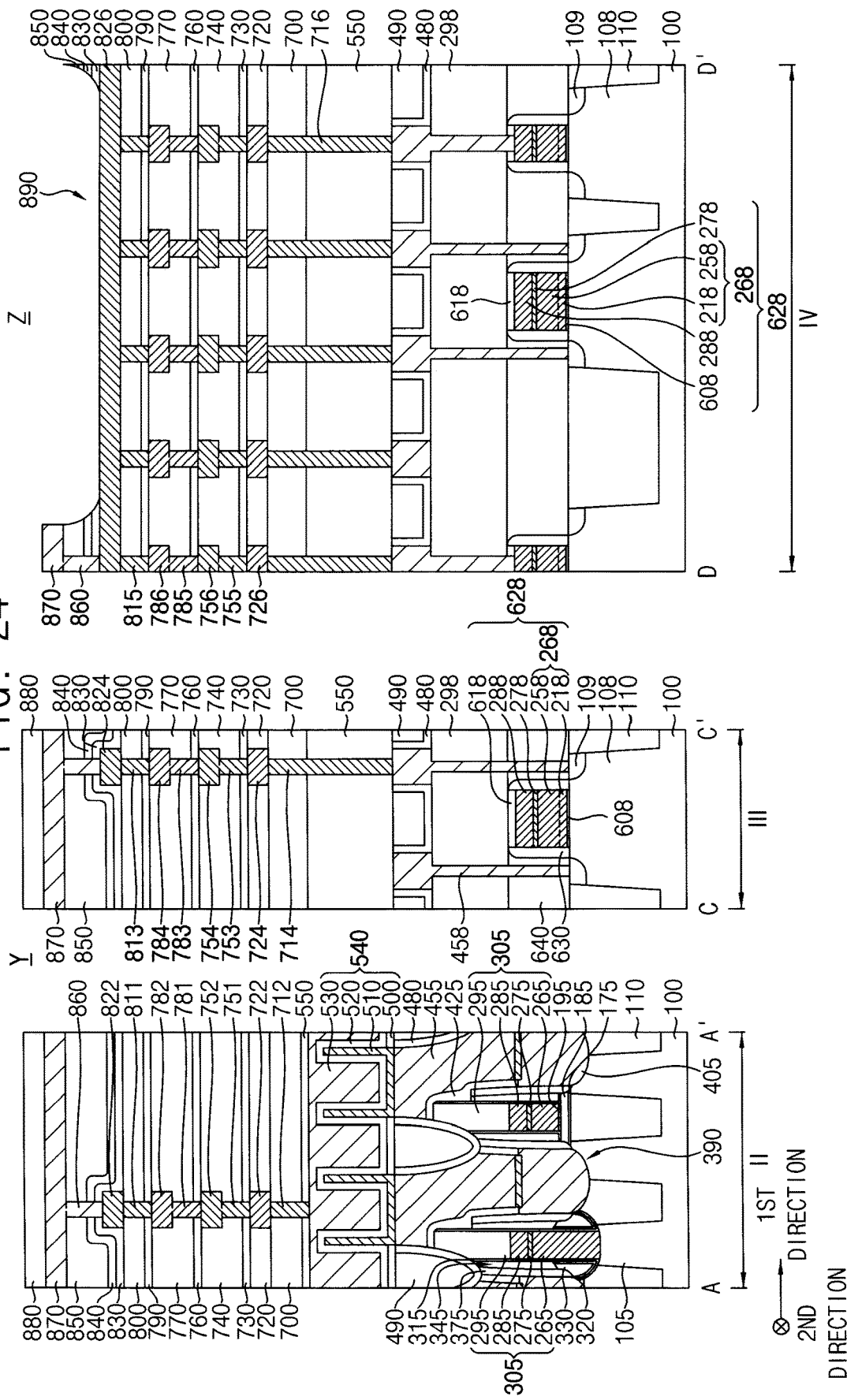

Referring to FIG. 24, a second protection layer 880 may be formed on the redistribution layer 870 and the second oxide layer 850, and a portion of the second protection layer 880 on the fourth region IV of the substrate 100 and a portion of the first protection layer structure thereunder may be removed to form a sixth opening 890 exposing an upper surface of the twelfth wiring 826.

The second protection layer 880 may include a photosensitive organic material, e.g., polyimide, and thus may include a thermosetting organic polymer and a photosensitive material. In example embodiments, the second protection layer 880 may be formed by a spin coating process, and may be cured by a heat treatment.

Semiconductor chips may be formed on the first regions I, respectively, of the substrate 100 by the above processes.

Figure 25:
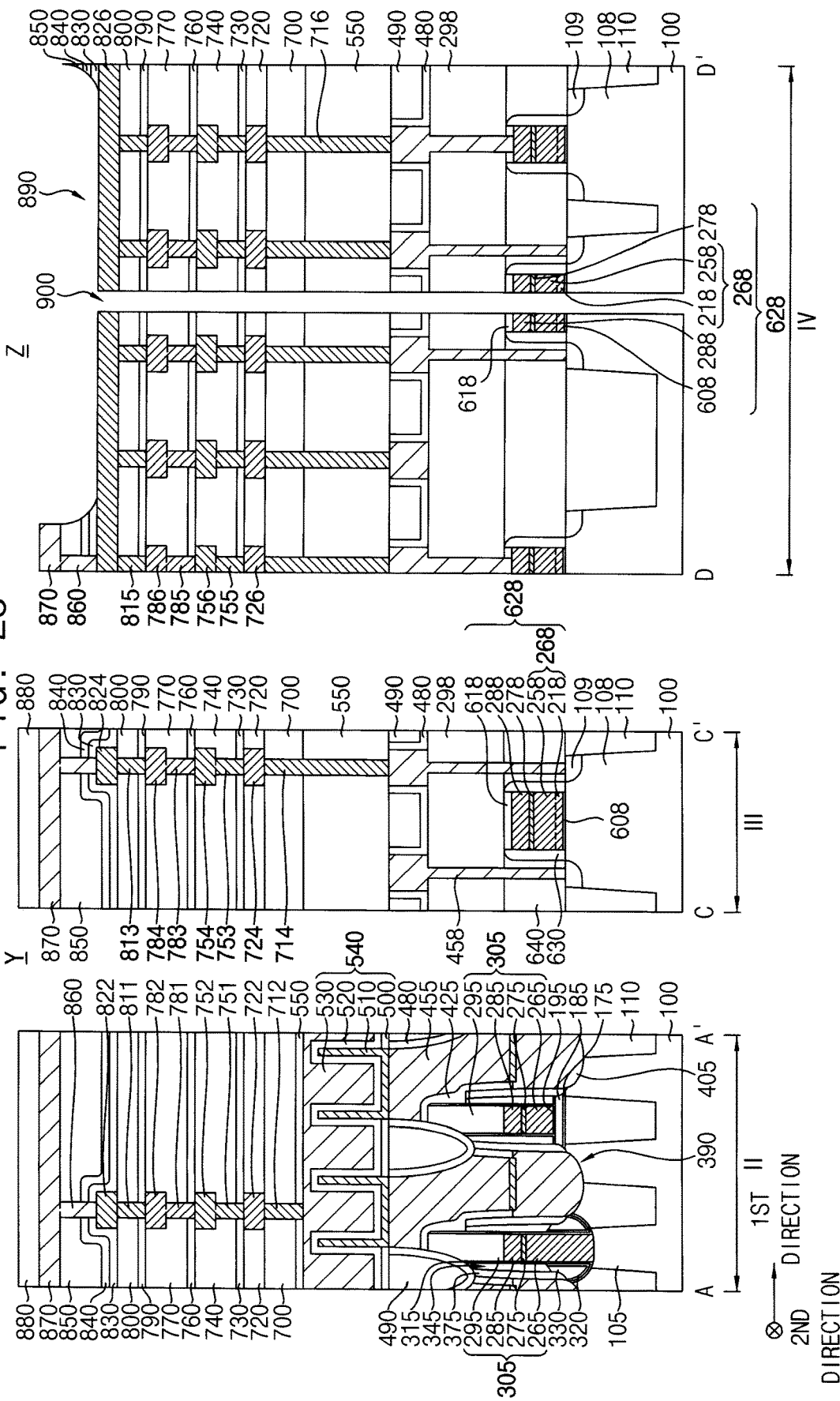

Referring to FIG. 25, a dicing process or a sawing process may be performed so that the semiconductor chips on the first regions I, respectively, of the substrate 100 may be spaced apart from each other, and thus a seventh opening 900 may be formed on the fourth region IV of the substrate 100.

The dicing process may include, e.g., a laser dicing process, a blade dicing process, etc., and a grinding process for removing a backside portion of the substrate 100 may be further performed before or after the dicing process.

In example embodiments, the seventh opening 900 formed by the dicing process may be formed between neighboring ones of the second conductive structures in the first direction, each of which may extend in the second direction, on the fourth region IV of the substrate 100. Thus, impact generated by the dicing process may be absorbed by the second conductive structure so as not to be spread outwardly.

Particularly, when the dicing process is performed, the dicing force may not be spread in the vertical direction but may be spread in the horizontal direction in the sixth to eighth insulating interlayers 720, 740, and 770 including a low-k dielectric material that may be relatively soft between the fifth and ninth insulating interlayers 700 and 800 including a relatively hard material. However, in example embodiments, the second conductive structures in the sixth to eighth insulating interlayers 720, 740, and 770 may extend in the vertical direction and the second direction, and thus the seventh opening 900 may be guided by the second conductive structures so as to be formed in the vertical direction between the second conductive structures.

Additionally, the first protection layer structure may not remain on a portion of the twelfth wiring 826 where the seventh opening 900 is formed unlike on the first region I of the substrate 100, and thus the impact by the dicing force may not be spread toward the first region I of the substrate 100 through the first protection layer structure.

Figure 26:
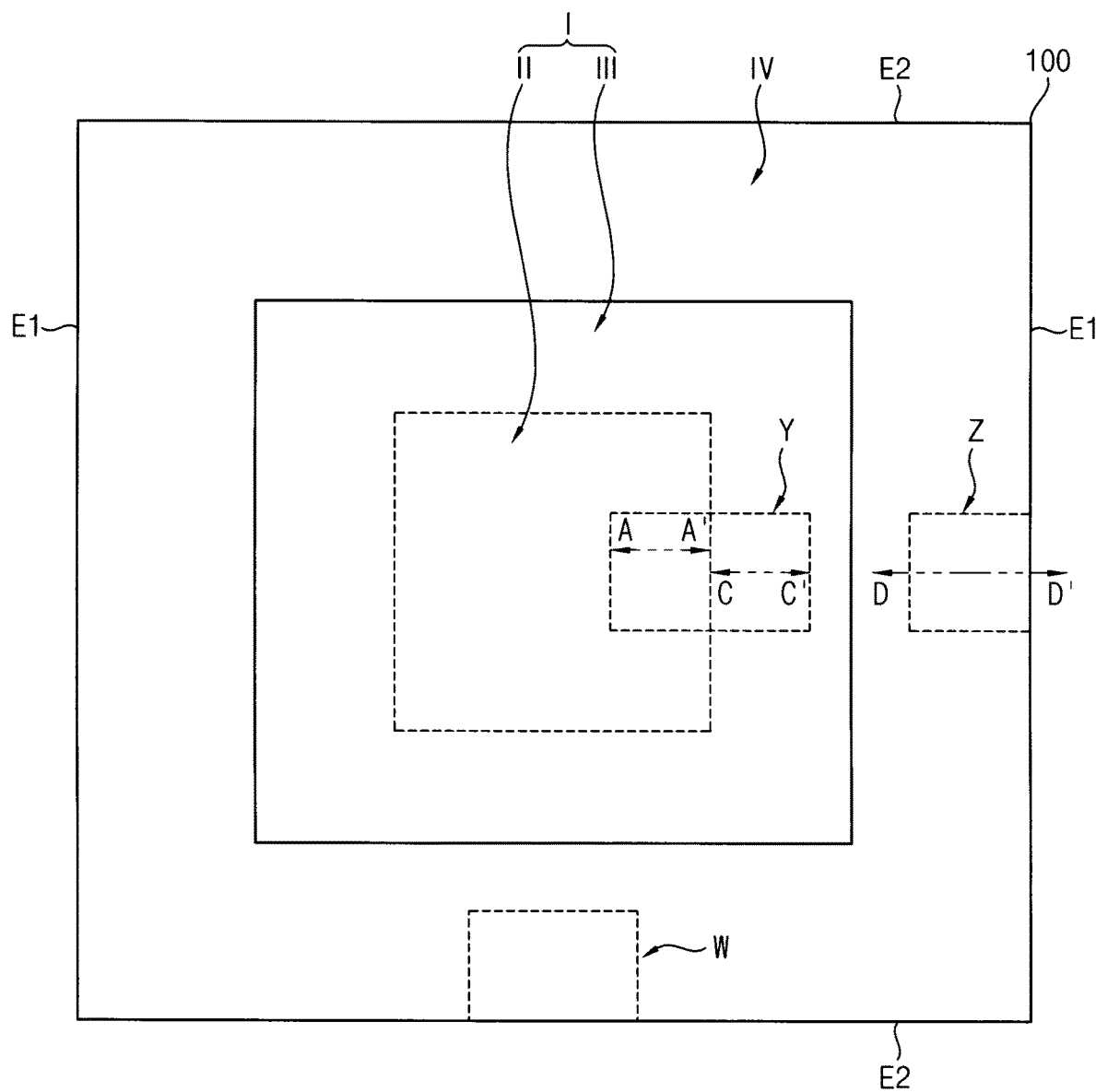
FIG. 26 is a plan view illustrating a semiconductor device in accordance with example embodiments, and FIG. 27 includes cross-sections taken along lines A-A', C-C' and D-D' of regions Y and Z of corresponding plan views.
Figure 27:
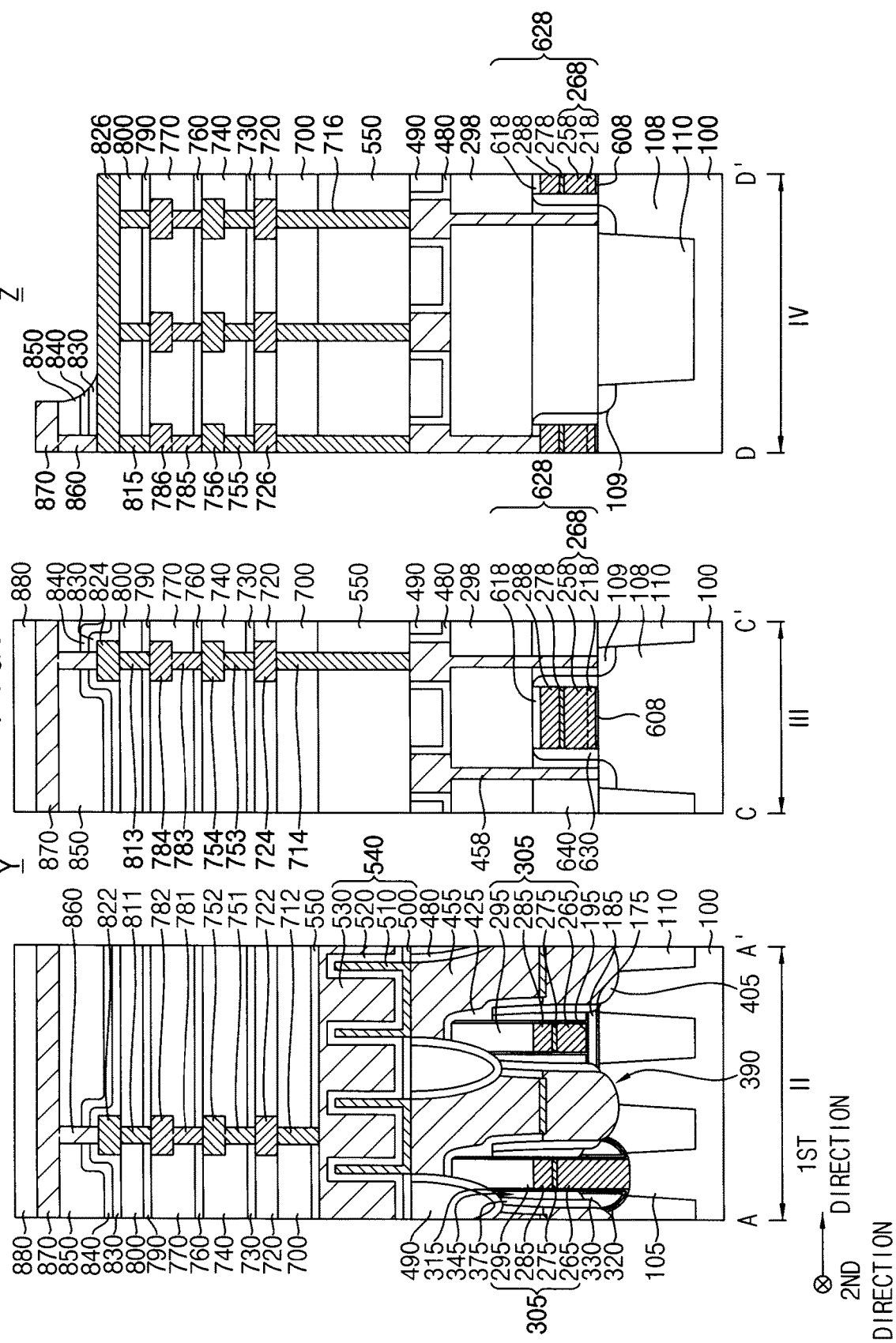

Thus, during the dicing process on the fourth region IV of the substrate 100, the spread of the impact to the first region I of the substrate 100 may be minimized, and thus the semiconductor chip on the first region I of the substrate 100 may have improved characteristics, which is shown in FIGS. 26 and 27.

FIG. 26 is a plan view illustrating a semiconductor device in accordance with example embodiments, and FIG. 27 includes cross-sections taken along lines A-A', C-C' and D-D' of regions Y and Z of corresponding plan views.

Referring to FIGS. 26 and 27, and FIG. 20, the fourth region IV of the substrate 100 surrounding the first region I of the substrate 100 may include first edges E1 opposite to each other in the first direction, each of which may extend in the second direction, and second edges E2 opposite to each other in the second direction, each of which may extend in the first direction. If the first and second directions are substantially perpendicular to each other, the outer contour of the fourth region IV of the substrate 100 may have a rectangular shape. Alternatively, if the first and second directions are not perpendicular to each other, the outer contour of the fourth region IV of the substrate 100 may have a shape of a parallelogram.

A portion of the TEG may remain on the fourth region IV of the substrate 100, and particularly, at least a portion of a pad of the TEG may remain on a portion of the region Z adjacent the first edge E1.

The pad of the TEG may include the second conductive structure having the third wiring 726, the third via 755, the sixth wiring 756, the sixth via 785, the ninth wiring 786, and the ninth via 815 sequentially stacked in the vertical direction, and the twelfth wiring 826 commonly contacting upper surfaces of a plurality of second conductive structures.

In example embodiments, the second conductive structure may extend in a direction substantially parallel to an extension direction of the first edge E1, that is, the second direction, and a plurality of second conductive structures may be formed to be spaced apart from each other in the first direction. The third wiring 726, the third via 755, the sixth wiring 756, the sixth via 785, and the ninth wiring 786 included in the second conductive structure may be formed in the sixth to eighth insulating interlayers 720, 740, and 770 including a low-k dielectric material, and the ninth via 815 included in the second conductive structure may be formed in the ninth insulating interlayer 800 including silicon oxide, e.g., TEOS.

Up to now, structures on the region Z adjacent the first edge E1 in the fourth region IV of the substrate 100 surrounding the first region I of the substrate 100 have been mainly illustrated, however, similar structures may be also formed on a region adjacent to the second edge E2 in the fourth region IV of the substrate 100, e.g., a region W.

For example, in region W, which is formed adjacent to the second edge E2, the third, sixth, and ninth wirings 726, 756, and 786 and the third and sixth vias 755 and 785 may be formed, and may be referred to as a conductive structure. For example, each conductive structure formed on a portion of the scribe lane region of the substrate 100 to the second edge E2 may include the third, sixth, and ninth wirings 726, 756, and 786 and the third and sixth vias 755 and 785. Each conductive structure may be substantially perpendicular to an upper surface of the substrate 100. For example, when viewed in cross-section, the vertical central axes of each of the third, sixth, and ninth wirings 726, 756, and 786 and the third and sixth vias 755 and 785 may extend in a direction that is substantially perpendicular to the top surface of the substrate. In some embodiments, when viewed in cross-section, the vertical central axes of each of the third, sixth, and ninth wirings 726, 756, and 786 and the third and sixth vias 755 and 785 may be substantially aligned with one another. Each of the ninth vias 815 may be formed to extend through the ninth insulating interlayer 800 to contact a corresponding one of the conductive structures including the third, sixth, and ninth wirings 726, 756, and 786 and the third and sixth vias 755 and 785, and the twelfth wiring 826 may be formed on the upper surfaces of the ninth insulating interlayer 800 and the ninth vias 815, commonly contacting the upper surfaces of the ninth vias 815.

Particularly, in the example of region W, the seventh opening 900 may be formed to extend in a direction substantially parallel to an extension direction of the second edge E2. For example, the seventh opening 900 may be formed to extend in the first direction between the second conductive structures, each of which may extend in the first direction, by the dicing process or sawing process. Thus, the dicing process may be guided by the second conductive structure extending in the first direction, and thus may be formed not in the horizontal direction but in the vertical direction. Accordingly, the impact generated by the dicing process may be blocked by the second conductive structure, so as not to be spread to an inside of the semiconductor chip.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a substrate including:
a chip region; and
a scribe lane region surrounding the chip region, the scribe lane region having first edges opposite to each other and second edges opposite to each other, each of the first edges extending in a first direction and each of the second edges extending in a second direction crossing the first direction;
a first insulating interlayer structure on the scribe lane region of the substrate, the first insulating interlayer structure including a low-k dielectric material;
first conductive structures on a portion of the scribe lane region of the substrate adjacent to one of the first edges, each of the first conductive structures extending through the first insulating interlayer structure in a vertical direction substantially perpendicular to an upper surface of the substrate and extending in the first direction;
a second insulating interlayer on the first insulating interlayer structure, the second insulating interlayer including a material having a dielectric constant greater than that of the first insulating interlayer structure;
first vias on the scribe lane region of the substrate, each of the first vias extending in the first direction through the second insulating interlayer and at least a portion of the first insulating interlayer structure to contact one of the first conductive structures, and each of the first vias directly contacting the portion of the first insulating interlayer structure; and
a first wiring commonly contacting upper surfaces of the first vias,
wherein each of the first conductive structures includes second wirings and second vias alternately and repeatedly stacked in the vertical direction, and an uppermost one of the second wirings contacts a corresponding one of the first vias, and
wherein the second wirings on the respective second vias at a same level do not contact each other.

2. The semiconductor device according to claim 1, wherein each of the second wirings has an area greater than that of each of the second vias, in a plan view.

3. The semiconductor device according to claim 1, wherein each of the second wirings and each of the first and second vias has a bar shape extending in the first direction.

4. The semiconductor device according to claim 1, wherein each of the second wirings and each of the first and second vias have a mesh structure extending in the first direction.

5. The semiconductor device according to claim 1, wherein ones of the second wirings and the second vias have a bar shape extending in the first direction, and other ones of the second wirings and the second vias have a mesh structure extending in the first direction.

6. The semiconductor device according to claim 1, wherein the first and second directions are substantially perpendicular to each other, and the scribe lane region has a rectangular shape in a plan view.

7. The semiconductor device according to claim 1,
wherein the first insulating interlayer structure includes a low-k dielectric layer and an etch stop layer alternately and repeatedly stacked in the vertical direction, and
wherein the low-k dielectric layer includes porous silicon oxide (SiOCH), the etch stop layer includes silicon carbonitride (SiCN), and the second insulating interlayer includes tetraethyl orthosilicate (TEOS).

8. The semiconductor device according to claim 1, wherein the first conductive structure, the first via, and the first wiring are a portion of a test element group (TEG).

9. The semiconductor device according to claim 1, further comprising:
second conductive structures on a portion of the scribe lane region of the substrate adjacent to one of the second edges, each of the second conductive structures extending through the first insulating interlayer structure in the vertical direction and extending in the second direction;
second vias each extending in the second direction through the second insulating interlayer to contact one of the first conductive structures; and
a second wiring commonly contacting upper surfaces of the second vias.

10. The semiconductor device according to claim 1,
wherein the first insulating interlayer structure and the second insulating interlayer are also formed on the chip region of the substrate, and
wherein the semiconductor device further comprises:
a second conductive structure extending through the first insulating interlayer structure on the chip region of the substrate;
a second via extending through the second insulating interlayer on the chip region of the substrate; and
a second wiring on the second via on the chip region of the substrate.

11. The semiconductor device according to claim 10, further comprises:
a first protection layer structure on the second insulating interlayer, the first protection layer structure covering the second wiring;
a redistribution layer on the first protection layer structure, the redistribution layer being electrically connected to the second wiring; and
a second protection layer on the redistribution layer,
wherein at least a portion of the first wiring is not covered by the first protection layer structure.

12. The semiconductor device according to claim 11, wherein the first protection layer structure includes a first oxide layer, a nitride layer, and a second oxide layer sequentially stacked in the vertical direction.

13. The semiconductor device according to claim 10, further comprising:
a bit line structure on the chip region of the substrate;
a contact plug adjacent to the bit line structure, the contact plug extending in the vertical direction; and
a capacitor on the contact plug,
wherein the capacitor is electrically connected to the second conductive structure.

14. A semiconductor device comprising:
a substrate including:
a chip region; and
a scribe lane region surrounding the chip region, the scribe lane region having first edges opposite to each other and second edges opposite to each other, each of the first edges extending in a first direction and each of the second edges extending in a second direction crossing the first direction;
first and second insulating interlayers on the scribe lane region of the substrate;
contact plugs extending through the first and second insulating interlayers on the scribe lane region of the substrate;
conductive structures on the contact plugs, respectively, on a portion of the scribe lane region of the substrate adjacent to one of the first edges, the conductive structures including first wirings and first vias alternately and repeatedly stacked in a vertical direction substantially perpendicular to an upper surface of the substrate; and
a second wiring commonly contacting upper surfaces of the conductive structures,
wherein each of the first wirings and each of the first vias extend in the first direction,
wherein an uppermost one of the first vias of each of the conductive structures is contained in a third insulating interlayer and a portion of a first insulating interlayer structure, and other ones of the first vias and the first wirings of each of the conductive structures are contained in the first insulating interlayer structure, the uppermost one of the first vias of each of the conductive structures directly contacting the portion of the first insulating interlayer structure, and
wherein the first wirings on the respective first vias at a same level do not contact each other.

15. The semiconductor device according to claim 14,
wherein a material of the first insulating interlayer structure is softer than that of the second insulating interlayer.

16. The semiconductor device according to claim 15,
wherein the first insulating interlayer structure includes a low-k dielectric layer and an etch stop layer alternately and repeatedly stacked in the vertical direction, and
wherein the low-k dielectric layer includes porous silicon oxide (SiOCH), the etch stop layer includes silicon carbonitride (SiCN), and the second insulating interlayer includes tetraethyl orthosilicate (TEOS).

17. A semiconductor device comprising:
a substrate including:
a chip region; and
a scribe lane region surrounding the chip region, the scribe lane region having first edges opposite to each other and second edges opposite to each other, each of the first edges extending in a first direction and each of the second edges extending in a second direction crossing the first direction,
the substrate having first and second active patterns on the chip region and the scribe lane region, the first and second active patterns being defined by an isolation pattern on the substrate;
a gate structure provided at an upper portion of the first active pattern;
a bit line structure on the chip region of the substrate;
a first contact plug on the first active pattern;
a capacitor on the first contact plug;
a second contact plug on the capacitor;
a third contact plug on the second active pattern;
a first insulating interlayer containing the second and third contact plugs;
a second insulating interlayer structure on the first insulating interlayer;

conductive structures on a portion of the scribe lane region of the substrate adjacent to one of the first edges, each of the conductive structures extending through the second insulating interlayer structure in a vertical direction substantially perpendicular to an upper surface of the substrate and extending in the first direction;

a third insulating interlayer on the second insulating interlayer structure, the third insulating interlayer including a material having a dielectric constant greater than that of the second insulating interlayer structure;

first vias on the scribe lane region of the substrate, each of the first vias extending in the first direction through the third insulating interlayer and at least a portion of the second insulating interlayer structure to contact one of the conductive structures on the scribe lane region of the substrate, and each of the first vias directly contacting the portion of the second insulating interlayer structure; and a first wiring commonly contacting upper surfaces of the first vias, wherein each of the conductive structures includes second wirings and second vias alternately and repeatedly stacked in the vertical direction, and an uppermost one of the second wirings contacts a corresponding one of the first vias, and wherein the second wirings on the respective second vias at a same level do not contact each other.

18. The semiconductor device according to claim 17, wherein each of the second wirings and each of the first and second vias has a bar shape extending in the first direction.

* * * * *